United States Patent
Broadway et al.

(10) Patent No.: US 10,406,439 B1
(45) Date of Patent: Sep. 10, 2019

(54) METHOD AND SYSTEM FOR FACILITATING GENERATION OF A VIRTUAL WORLD INCLUDING ONE OR MORE OBJECTS AND ONE OR MORE AGENTS BASED ON A USER INTENTION

(71) Applicants: Janet Marie Broadway, Valley Village, CA (US); Steve Barazza, Valley Village, CA (US)

(72) Inventors: Janet Marie Broadway, Valley Village, CA (US); Steve Barazza, Valley Village, CA (US)

(*) Notice: Subject to any disclaimer, the term of this patent is extended or adjusted under 35 U.S.C. 154(b) by 0 days.

(21) Appl. No.: 16/280,630

(22) Filed: Feb. 20, 2019

Related U.S. Application Data

(60) Provisional application No. 62/632,896, filed on Feb. 20, 2018.

(51) Int. Cl.
| | |
|---|---|
| A63F 13/25 | (2014.01) |
| A63F 13/42 | (2014.01) |
| A63F 13/56 | (2014.01) |
| A63F 13/57 | (2014.01) |
| A63F 13/23 | (2014.01) |
| G06F 17/50 | (2006.01) |
| H04L 29/06 | (2006.01) |
| A63F 13/807 | (2014.01) |
| A63F 13/216 | (2014.01) |

(52) U.S. Cl.
CPC .............. *A63F 13/57* (2014.09); *A63F 13/23* (2014.09); *G06F 17/5009* (2013.01); *A63F 13/216* (2014.09); *A63F 13/807* (2014.09); *A63F 2300/1025* (2013.01); *A63F 2300/64* (2013.01); *A63F 2300/8041* (2013.01); *H04L 67/38* (2013.01)

(58) Field of Classification Search
CPC ........... A63F 13/25; A63F 13/42; A63F 13/56
See application file for complete search history.

(56) References Cited

U.S. PATENT DOCUMENTS

2015/0297987 A1* 10/2015 Mehra ................. A63F 13/2145
  463/36
2016/0293133 A1* 10/2016 Dutt ......................... G06F 8/20

* cited by examiner

*Primary Examiner* — Omkar A Deodhar

(57) ABSTRACT

A system of facilitating generation of a virtual world including one or more objects and one or more agents based on a user intention is disclosed. The system may include a communication device configured for receiving an input from a user for an agent in one or more agents. Further, the system may include a processing device configured to calculate strength of a spatial relationship based on a distance between an object in one or more objects and the agent, determine strength of an intersection relationship based on a direction and a velocity of approach between the agent and the object, obtain an interaction relationship based on an action performed by the agent and an object reaction to the agent action, and perform an interaction between the agent and the object based on the special relationship, the intersection relationship and interaction relationship.

20 Claims, 20 Drawing Sheets

METHOD AND SYSTEM FOR FACILITATING GENERATION OF A VIRTUAL WORLD INCLUDING ONE OR MORE OBJECTS AND ONE OR MORE AGENTS BASED ON A USER INTENTION

FIELD OF THE INVENTION

The present invention relates generally to data processing. More specifically, the present invention describes methods and systems to facilitate the simulation of realistic interactions between physical objects in a virtual space based on user intention.

BACKGROUND OF THE INVENTION

Simulation systems have numerous uses in various industries. With an improvement in computing systems, simulation systems and simulation programs have become increasingly realistic. Simulation programs are used in the auto industry, the aviation industry, and even in multiple sports to improve the athletes involved. Further, simulation software, such as video games are also used for personal recreation.

However, existing simulation systems only work on a preset and predefined set of controls. Existing simulation systems are unable to account for the intention of the user in the manipulation of the simulation systems.

Further, existing simulation systems do not account for the intention of the user and make use of the intention in making the simulation more realistic.

Further, existing simulation systems may not make use of pass or fail tests based on the physics of the simulation systems to determine whether an action in the simulation may be possible.

Therefore, there is a need for improved methods and systems for facilitating generation of a virtual world including one or more objects and one or more agents based on a user intention that may overcome one or more of the above-mentioned problems and/or limitations.

SUMMARY OF THE INVENTION

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

According to some embodiments, a system of facilitating generation of a virtual world including one or more objects and one or more agents based on a user intention is disclosed. The system may include a communication device configured for receiving an input from a user for an agent in one or more agents. Further, each agent in the one or more agents may be defined by a position, an angular threshold of influence and an area of influence. Further, the system may include a processing device configured to calculate strength of a spatial relationship based on a distance between an object in one or more objects and the agent. Further, each object in the one or more objects may be defined by a position, an angular threshold of influence and an area of influence. Further, the processing device may be configured to determine strength of an intersection relationship based on a direction and a velocity of approach between the agent and the object. Further, the processing device may be configured to obtain an interaction relationship based on an action performed by the agent and an object reaction to the agent action. Further, the action and the reaction may be predefined. Further, the processing device may be configured to perform an interaction between the agent and the object based on the special relationship, the intersection relationship and interaction relationship.

According to some embodiments. a method of facilitating generation of a virtual world including one or more objects and one or more agents based on a user intent is disclosed. The method may include receiving, using a communication device, an input from a user for an agent in one or more agents. Further, each agent in the one or more agents may be defined by a position, an angular threshold of influence and an area of influence. Further, the method may include calculating, using a processing device, strength of a spatial relationship based on a distance between an object in one or more objects and the agent. Further, each object in the one or more objects may be defined by a position, an angular threshold of influence and an area of influence. Further, the method may include determining, using the processing device, strength of an intersection relationship based on a direction and a velocity of approach between the agent and the object. Further, the method may include obtaining, using the processing device, an interaction relationship based on an action performed by the agent and an object reaction to the agent action. Further, the action and the reaction may be predefined. Further, the method may include performing, using the processing device, an interaction between the agent and the object based on the special relationship, the intersection relationship and interaction relationship.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAIL DESCRIPTIONS OF THE INVENTION

Figure 1:
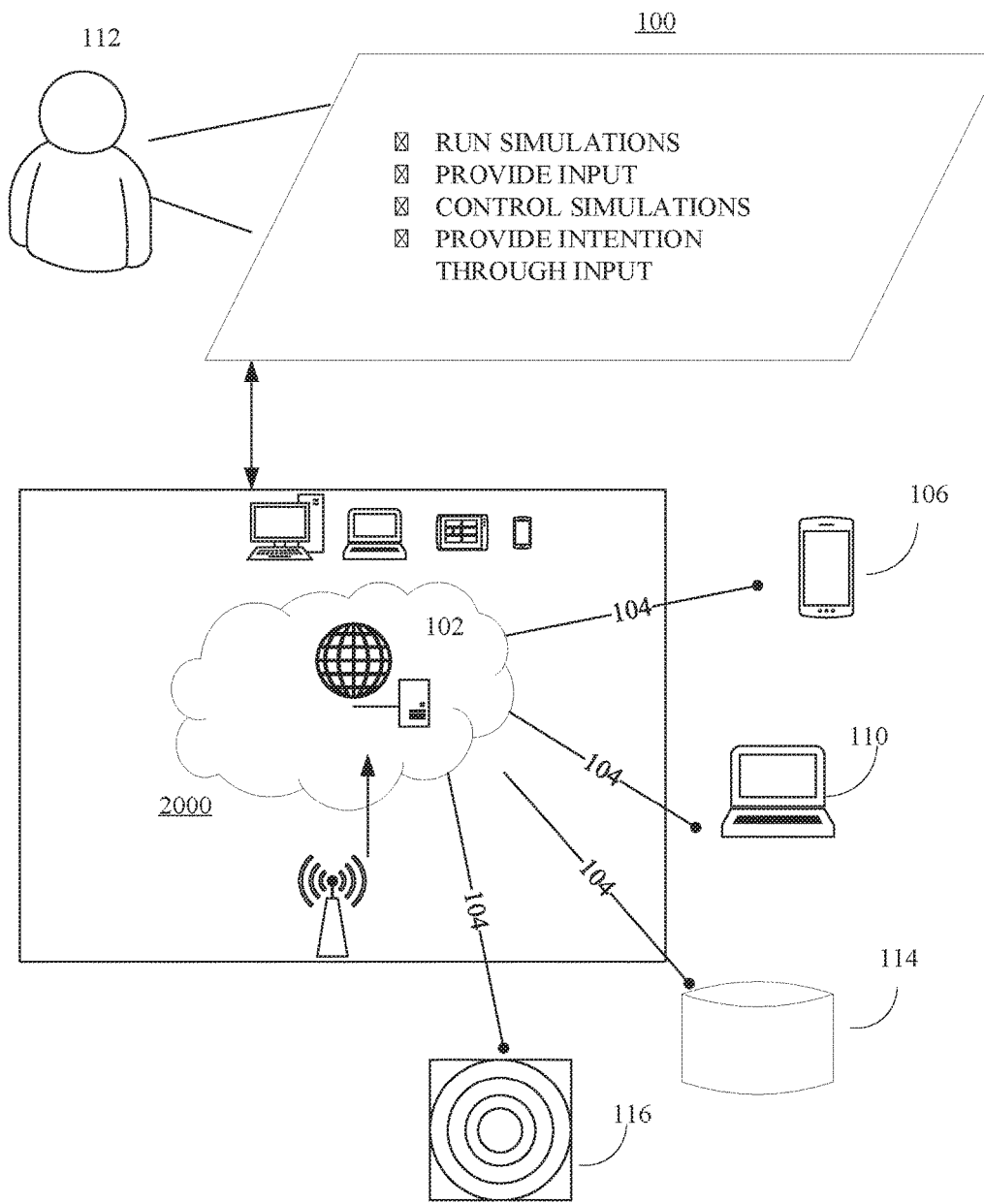
FIG. 1 is an illustration of an online platform consistent with various embodiments of the present disclosure.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of facilitation of simulation of realistic interactions between physical objects in a virtual space based on user intention, embodiments of the present disclosure are not limited to use only in this context.

FIG. 1 is an illustration of an online platform 100 consistent with various embodiments of the present disclosure. By way of non-limiting example, the online platform 100 to facilitate the simulation of realistic interactions between physical objects in a virtual space based on user intention may be hosted on a centralized server 102, such as, for example, a cloud computing service. The centralized server 102 may communicate with other network entities, such as, for example, a mobile device 106 (such as a smartphone, a laptop, a tablet computer etc.), other electronic devices 110 (such as desktop computers, server computers etc.), databases 114 (such as video game databases), and sensors 116 (such as sensors associated with video game systems and consoles, including cameras, motion sensors, and so on), over a communication network 104, such as, but not limited to, the Internet. Accordingly, in some instances, electronic devices operated by the one or more relevant parties may be in communication with the platform.

A user 112, such as the one or more relevant parties, may access online platform 100 through a web based software application or browser. The web based software application may be embodied as, for example, but not be limited to, a website, a web application, a desktop application, and a mobile application compatible with a computing device 2000.

According to some embodiments, the online platform 100 may be configured to communicate with a system to facilitate the simulation of realistic interactions between physical objects in a virtual space based on user intention. The one or more simulations or realistic interactions may take place in video games. Alternatively, in an embodiment, the one or more simulations of realistic interactions may take place in simulation software that may be used for modeling real-life phenomenon. Interactions between physical objects may allow for a transfer of force and energy between the objects through collisions, or touches.

Accordingly, the system may include a user device that may be used to run the simulation of interactions between objects. The user device may be a mobile device such as, but not limited to, a smartphone, or a computer tablet, a computing device like a personal computer, or a laptop, or a video game console. The user device may include a communication device configured to communicate over a communication network such as, but not limited to, a cellular network, a satellite network, a personal area network, Bluetooth, Internet and so on. Further, the user device may include sensors, such as a location sensor (e.g. a GPS) that may be used to retrieve additional information and monitor additional parameters related to the user.

Further, the system may include a user device that may be a user side controller. The user side controller may be an input device that may be used to provide an input into the system running a simulation, such as sensors 116. Accordingly, the user side controller may be a controlling device, such as a joystick or a video game console, or a generic input device such as a keyboard. Alternatively, the user side controller may be a special device that may be particular to the simulation that may be running to provide an input corresponding to the simulation. For instance, the special user side controller may be, but may not be limited to a racing wheel if the simulation is a racing game or a voice-based controller that may receive voice inputs through a microphone and influence the simulation that may be running.

Further, the system may recognize user intention. User intention may be defined as the objective of a user to perform a certain action in a simulation. Accordingly, with respect to a simulation that may be running, one or more user intents, that may influence one or more events or scenarios in the simulation, may exist. User intents may be used for controlling one or more physical objects in the simulation and influencing the one or more events or scenarios in the simulation. Accordingly, the one or more user intentions may be mapped to one or more input values associated with one or more user side controllers that may be used to control the one or more physical objects in the simulation.

Further, the system may create an intention processing layer beyond an event handler in the simulation. The event handler of the simulation may recognize one or more movements by objects in the virtual space of the simulation. The one or more movements by one or more by objects in the simulation, called as events, may trigger further related one or movements by objects in the virtual space of the simulation. The intention processing layer may be created beyond the event handler in the simulation. The intention processing layer may perform recognition of user intention with respect to the applicability of the user intention in a scenario of the simulation. User input may be received from one or more connected user side controllers. Certain pre-defined input values of the one or more user side controllers may correspond to one or more user intentions that may include the performance of certain actions in the simulation by one or more objects in the simulation. Accordingly, the one or more actions defined by the one or more user intentions may be subject to a pass or fail test subject to the physical laws of the simulation. If the one or more actions performable by the one or more objects in the simulation pass the test, the one or more objects may perform the one or more actions and may interact in the manner as recognized in the one or more user intentions. Alternatively, if the one or more actions performable by the one or more objects in the simulation fail test subject to the physical laws of the simulation, the one or more objects may not be able to perform the one or more actions. For instance, if the simulation is a pinball game, the objects in the simulation may include a pinball and a paddle. The pinball, which may be falling in a certain direction. As such, one or more user intentions may define the action for the paddle to hit the falling pinball. Accordingly, the action may be subject to a pass or fail physics text and the paddle may or may not hit the falling pinball on the basis of the result of the pass or fail test.

Figure 2:
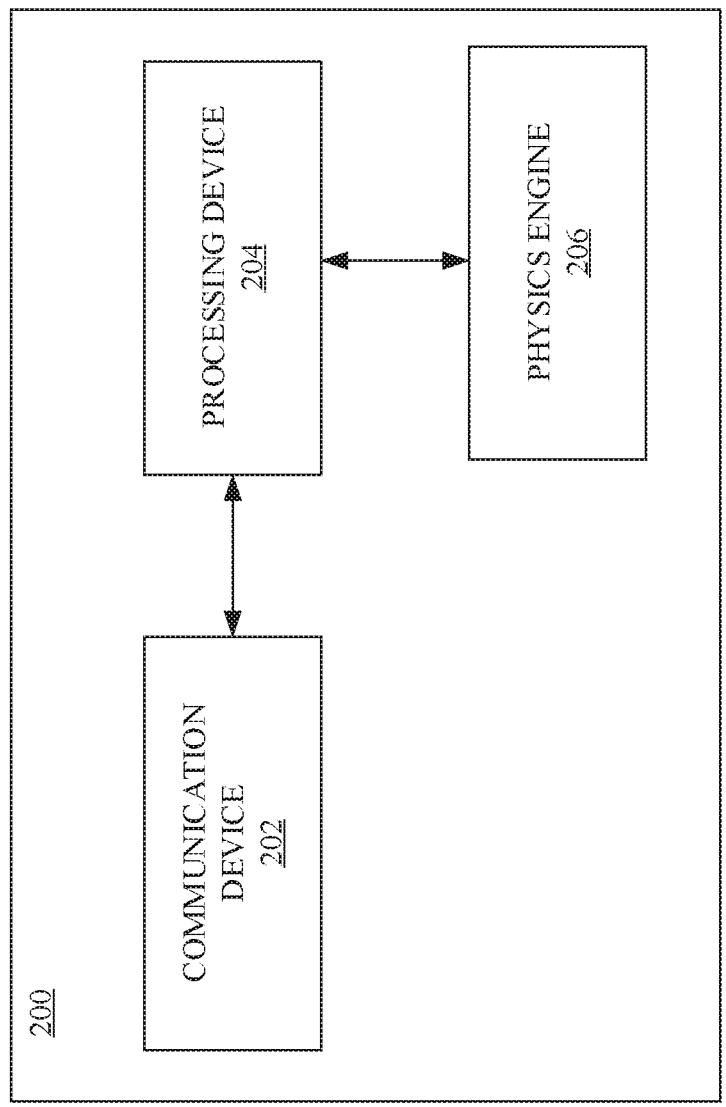
FIG. 2 is a system of facilitating generation of a virtual world including one or more objects and one or more agents based on a user intention.

FIG. 2 is a system 200 of facilitating generation of a virtual world including one or more objects and one or more agents based on a user intention. Further, the virtual world may include at least one scene, comprising at least one frame, and including one or more of physical and non-physical objects. Further, the virtual world may include one or more of a virtual simulation, a video game, and so on. Further, a placement and movement of the non-physical objects may be controllable by a game engine. Further, the game engine may be programmable by a programmer while creation of the virtual scene, to specify and control the placement and movement of the one or more non-physical objects. Further, the game engine may pass the physical parameters of the one or more physical objects to a physics engine 206.

Further, the system 200 may include a communication device 202 configured for receiving an input from a user for an agent in one or more agents. Further, each agent in the one or more agents may be defined by a position, an angular threshold of influence and an area of influence. Further, each agent in the one or more agents may be controllable by the user using a control device, including a joystick, a keypress of a keyboard, sensory input corresponding to VR and AR controllers, and so on. Further, a will of the user to interact with an object in the virtual scene, including the one or more physical objects and non-physical objects may constitute user intention. Further, user intention may be determinable by a weight of order of probability in consideration of a strength of a spatial relationship between the one or more objects and the agent, a strength of an intersection relationship, and an ability of the agent to win the interaction relationship for all objects in a scene for each frame of the scene.

Further, the system 200 may include a processing device 204 configured to calculate the strength of the spatial relationship based on a distance between an object in one or more objects and the agent. Further, each object in the one or more objects may be defined by a position, an angular threshold of influence and an area of influence. Further, the processing device 204 may be configured to determine the strength of an intersection relationship based on a direction and a velocity of approach between the agent and the object. Further, the processing device 204 may be configured to obtain an interaction relationship based on an action performed by the agent and an object reaction to the agent action. Further, the action and the reaction may be predefined. Further, the processing device 204 may be configured to perform an interaction between the agent and the object based on the special relationship, the intersection relationship, and interaction relationship. Further, the performing the interaction may include initiating a default action when no other action may be engaged. Further, the performing the interaction may include initiating the default action based on the user intention. Further, when user intention may have been established and an influence of spatial relationship and angular threshold of the intersection relationship be met, the user may engage a user action. Further, the performing the interaction may include rendering the virtual world visually to the user.

Further, in some embodiments, the communication device 202 may be configured to allow the user to control the one or more agents. Further, the processing device 204 may be configured to control, using a physics engine 206, the one or more objects and the one or more agents.

In some embodiments, the one or more agents and the one or more objects agent may have one or more dynamical properties.

Further, dynamical properties may be used to correlate movement. For instance, velocity of an object of the one or more objects, or an agent of the one or more agents may be adjusted to correlate movement between the physics engine 206, and the game engine resulting in a more realistic visual render.

Further, dynamical properties may be used to generate accurate predictions for interaction based on user interaction and user intention. Further, dynamical properties may be used to create scale relationships. Further, scale relationships may allow for physical properties of an object of the one or more objects to be defined at one value and changed in scale. Further, dynamical properties may be used to create physical relationships. When an object of the one or more objects may implement another object, the physical relationship may change the physical properties of both objects.

Further, dynamical properties may include a descriptive property used to describe the one or more agents and the one or more objects physically. Further, a descriptive property may include C++ Long datatype of 64 bits and may be bit masked for 8 bytes. Further, each byte may contain a physical property, including gravity, friction, power, weight, speed, acceleration, force, mass, and so on. Further, a descriptive property may be related to one or more of gravity, friction, power, weight, speed, acceleration, force and mass Further, dynamical properties may include an application property. Further, the application property may be an optional property and may be used by application methods of a physics module for real time physics simulation. Further, a physics module application interface may provide defined constants for applied physics.

In some embodiments, the system 200 may further include predicting, using the processing device 204, one or more parameters of the interaction based on the dynamical properties of the agent and the object using the physics engine 206. Further, the physics engine 206 may move the one or more agents and the one or more objects according to laws of physics In some embodiments, the strength of the spatial relationship may be measured, using the processing device 204, from an origin point in a 2-Dimensional (2D space), when the virtual world may be a 2D virtual world. Further, the strength of the spatial relationship may be measured, using the processing device 204, from a world center in a 3-Dimensional (3D space), when the virtual world may be a 3D virtual world.

In some embodiments, for the intersection relationship, the velocity may include a rate of change of spatial relationship between the object and the agent. Further, the agent may possess a potential to intersect with other objects in space. Further, when the agent or object may be moved, the spatial relationship between the object and the agent may be changed. Further, the change in the spatial relationship between the object and the agent may add a magnitude creating a vector. The intersection potential between the object and the agent may be increased or decreased. Which may comprise the intersection relationship. Further, for the intersection relationship, the direction may be ascertained, using the processing device 204, based on the angular threshold of influence of both the agent and the object.

In some embodiments, the direction may be one of "with", "against" and "neutral". Further, the "with" direction may be assigned, using the processing device 204, when the object and the agent head in the same direction. Further, the "against" direction may be assigned, using the processing device 204, when the object and the agent head towards each other. Further, the "neutral" direction may be assigned, using the processing device 204, when the object and the agent may be moving parallel to each other.

In some embodiments, the interaction may be based on the interaction relationship when the action and reaction may be congruent. Further, the interaction may be determined, using the processing device 204, by a physics engine 206, when the action and reaction may be incongruent. Further, the agent may interact with the one or more objects in the virtual world. Further, the interaction relationship may describe how the agent may use the one or more objects. Further, a reaction of an object of the one or more objects being used by the agent may describe the intersection relationship. Further, the interaction and reaction may include predefined constants expressed as verbs. Further, a plurality of definitions of verbs may exist. Further, additional definitions of verbs may be added using the communication device 202 as required. Further, interaction relationships may not have strength. Further, when interaction and reaction may be congruent, interaction relationships may work together. Further, when interaction and reaction may work against each other, interaction relationships may be called as incongruent or pass, and a "winner" may be determined by application of physics.

In some embodiments, the processing device 204 may be further configured for periodically updating spatial relationships, intersection relationships and interaction relationships among the one or more objects and the one or more agents.

In some embodiments, the processing device 204 may be further configured for calculating strengths of one or more spatial relationships for each of the one or more objects and the agent; determine strengths of one or more intersection relationships based on a direction and a velocity of approach between each of the one or more objects and the agent; obtain one or more interaction relationships based on an agent action performed by the agent and one or more object reactions to the agent action; deduce a winner interaction based on the strengths of the one or more spatial relationships, the strengths of the one or more intersection relationships and the one or more interaction relationships; and perform the winner interaction.

In some embodiments, the processing device 204 may be further configured for calculating strengths of one or more spatial relationships for each of the one or more objects and the agent.

In some embodiments, the processing device 204 may be further configured for determining strengths of one or more intersection relationships based on a direction and a velocity of approach between each of the one or more objects and the agent.

In some embodiments, the processing device 204 may be further configured for obtaining one or more interaction relationships based on an agent action performed by the agent and one or more object reactions to the agent action.

In some embodiments, the processing device 204 may be further configured for deducing a winner interaction based on the strengths of the one or more spatial relationships, the strengths of the one or more intersection relationships and the one or more interaction relationships.

In some embodiments, the processing device 204 may be further configured for performing the winner interaction.

Figure 3:
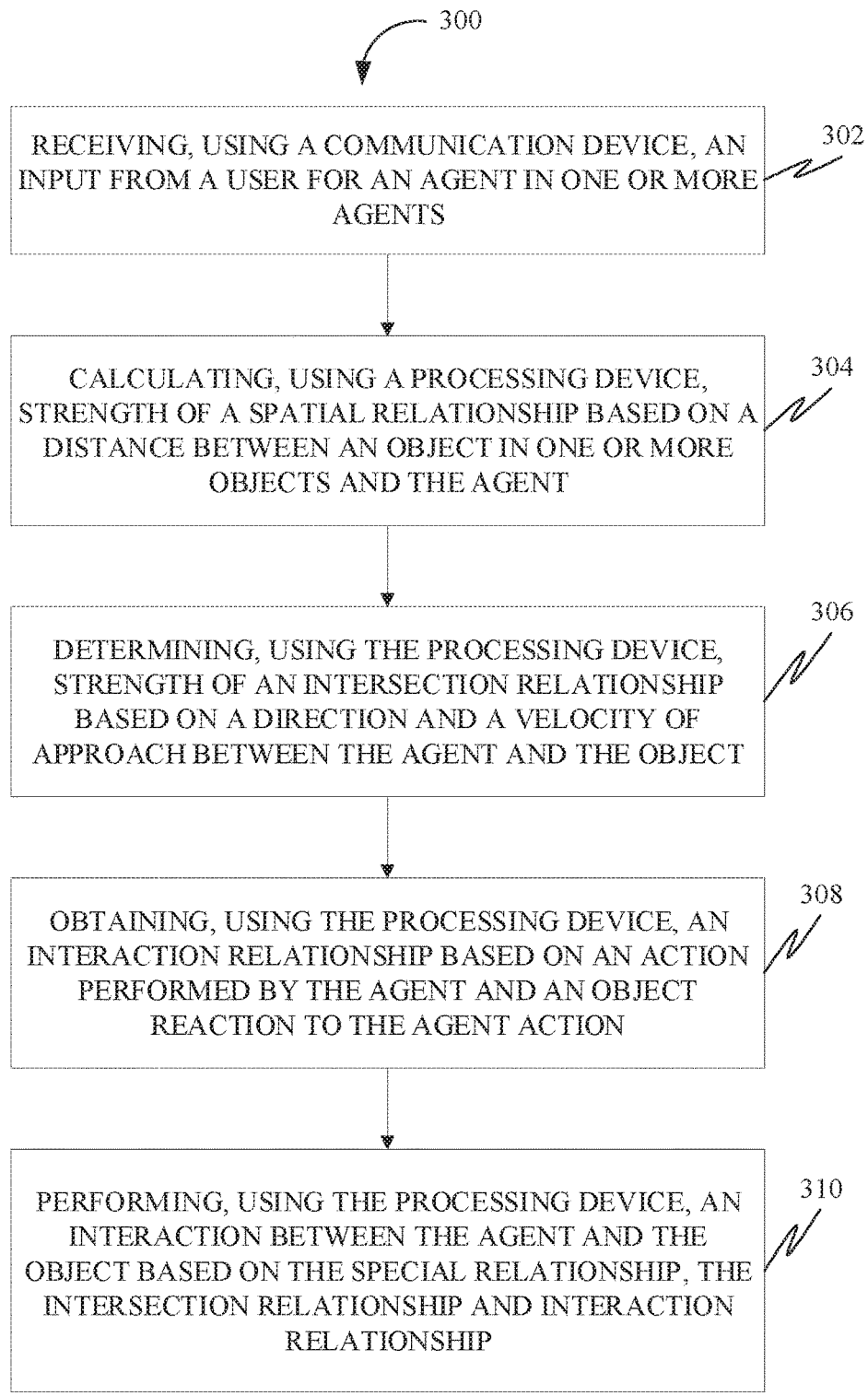
FIG. 3 shows a method of facilitating generation of a virtual world including one or more objects and one or more agents based on a user intention.

FIG. 3 shows a method 300 of facilitating generation of a virtual world including one or more objects and one or more agents based on a user intention. Further, the virtual world may include at least one scene, comprising at least one frame, and including one or more of physical and non-physical objects. Further, the virtual world may include one or more of a virtual simulation, a video game, and so on. Further, a placement and movement of the non-physical objects may be controllable by a game engine. Further, the game engine may be programmable by a programmer while creation of the virtual scene, to specify and control the placement and movement of the one or more non-physical objects. Further, the game engine may pass the physical parameters of the one or more physical objects to a physics engine, such as the physics engine 206.

At 302, the method 300 may include receiving, using a communication device, such as the communication device 202, an input from a user for an agent in one or more agents. Further, each agent in the one or more agents may be defined by a position, an angular threshold of influence and an area of influence. Further, each agent in the one or more agents may be controllable by the user using a control device, including a joystick, a keypress of a keyboard, sensory input corresponding to VR and AR controllers, and so on. Further, a will of the user to interact with an object in the virtual scene, including the one or more physical objects and non-physical objects may constitute user intention. Further, user intention may be determinable by a weight of order of probability in consideration of a strength of a spatial relationship between the one or more objects and the agent, a strength of an intersection relationship, and an ability of the agent to win the interaction relationship for all objects in a scene for each frame of the scene.

Further, at 304, the method 300 may include calculating, using a processing device, such as the processing device 204, the strength of the spatial relationship based on a distance between an object in one or more objects and the agent. Further, each object in the one or more objects may be defined by a position, an angular threshold of influence and an area of influence.

Further, at 306, the method 300 may include determining, using the processing device, strength of an intersection relationship based on a direction and a velocity of approach between the agent and the object.

Further, at 308, the method 300 may include obtaining, using the processing device, an interaction relationship based on an action performed by the agent and an object reaction to the agent action. Further, the action and the reaction may be predefined.

Further, at 310, the method 300 may include performing, using the processing device, an interaction between the agent and the object based on the special relationship, the intersection relationship, and interaction relationship. Further, the performing the interaction may include initiating a default action when no other action may be engaged. Further, the performing the interaction may include initiating the default action based on the user intention. Further, when user intention may have been established and an influence of spatial relationship and angular threshold of the intersection relationship be met, the user may engage a user action. Further, the performing the interaction may include rendering the virtual world visually to the user.

In some embodiments, the user may control, using the communication device, the one or more agents. Further, the physics engine may control, using the processing device, the one or more objects, and the one or more agents.

In some embodiments, the one or more agents and the one or more objects may have one or more dynamical properties.

Further, dynamical properties may be used to correlate movement. For instance, velocity of an object of the one or more objects, or an agent of the one or more agents may be adjusted to correlate movement between the physics engine, and the game engine resulting in a more realistic visual render.

Further, dynamical properties may be used to generate accurate predictions for interaction based on user interaction and user intention. Further, dynamical properties may be used to create scale relationships. Further, scale relationships may allow for physical properties of an object of the one or more objects to be defined at one value and changed in scale. Further, dynamical properties may be used to create physical relationships. When an object of the one or more objects may implement another object, the physical relationship may change the physical properties of both objects.

Further, dynamical properties may include descriptive properties used to describe an object physically. Further, descriptive properties may include C++ Long datatype of 64 bits and may be bit masked for 8 bytes. Further, each byte may contain a physical property, including gravity, friction, power, weight, speed, acceleration, force, mass, and so on.

Further, dynamical properties may include an application property. Further, the application property may be an optional property and may be used by application methods of a physics module for real time physics simulation. Further, a physics module application interface may provide defined constants for applied physics.

In some embodiments, the method 300 may further include predicting, using the processing device, one or more parameters of the interaction based on the dynamical properties of the agent and the object using the physics engine. Further, the physics engine may move the one or more agents and the one or more objects according to laws of physics, such as Newton's third law of motion.

In some embodiments, the strength of the spatial relationship may be measured, using the processing device, from an origin point in a 3-Dimensional (2D) space, when the virtual world may be a 3D virtual world. Further, the strength of the spatial relationship may be measured, using the processing device, from a world center in a 4-Dimensional (3D) space, when the virtual world may be a 4D virtual world.

In some embodiments, for the intersection relationship, the velocity may include rate of change of spatial relationship between the object and the agent. Further, the agent may possess a potential to intersect with other objects in space. Further, when the agent or object may be moved, the spatial relationship between the object and the agent may be changed. Further, the change in the spatial relationship between the object and the agent may add a magnitude creating a vector. The intersection potential between the object and the agent may be increased or decreased. Which may comprise the intersection relationship. Further, for the intersection relationship the direction may be ascertained, using the processing device, based on the angular threshold of influence of both the agent and the object.

In some embodiments, the direction may be one of "with", "against" and "neutral". Further, the "with" direction may be assigned, using the processing device, when the object and the agent head in the same direction. Further, the "against" direction may be assigned, using the processing device, when the object and the agent head towards each other. Further, the "neutral" direction may be assigned, using the processing device, when the object and the agent may be moving parallel to each other.

In some embodiments, the interaction may be based on the interaction relationship when the action and reaction may be congruent. Further, the interaction may be determined, using the processing device, by a physics engine, when the action and reaction may be incongruent. Further, the agent may interact with the one or more objects in the virtual world. Further, the interaction relationship may describe how the agent may use the one or more objects. Further, a reaction of an object of the one or more objects being used by the agent may describe the intersection relationship. Further, the interaction and reaction may include predefined constants expressed as verbs. Further, a plurality of definitions of verbs may exist. Further, additional definitions of verbs may be added using the communication device as required. Further, interaction relationships may not have strength. Further, when interaction and reaction may be congruent, interaction relationships may work together. Further, when interaction and reaction may work against each other, interaction relationships may be called as incongruent or pass, and a "winner" may be determined by application of physics.

In some embodiments, the method 300 may further include periodically updating, using the processing device, spatial relationships, intersection relationships and interaction relationships among the one or more objects and the one or more agents.

Figure 4:
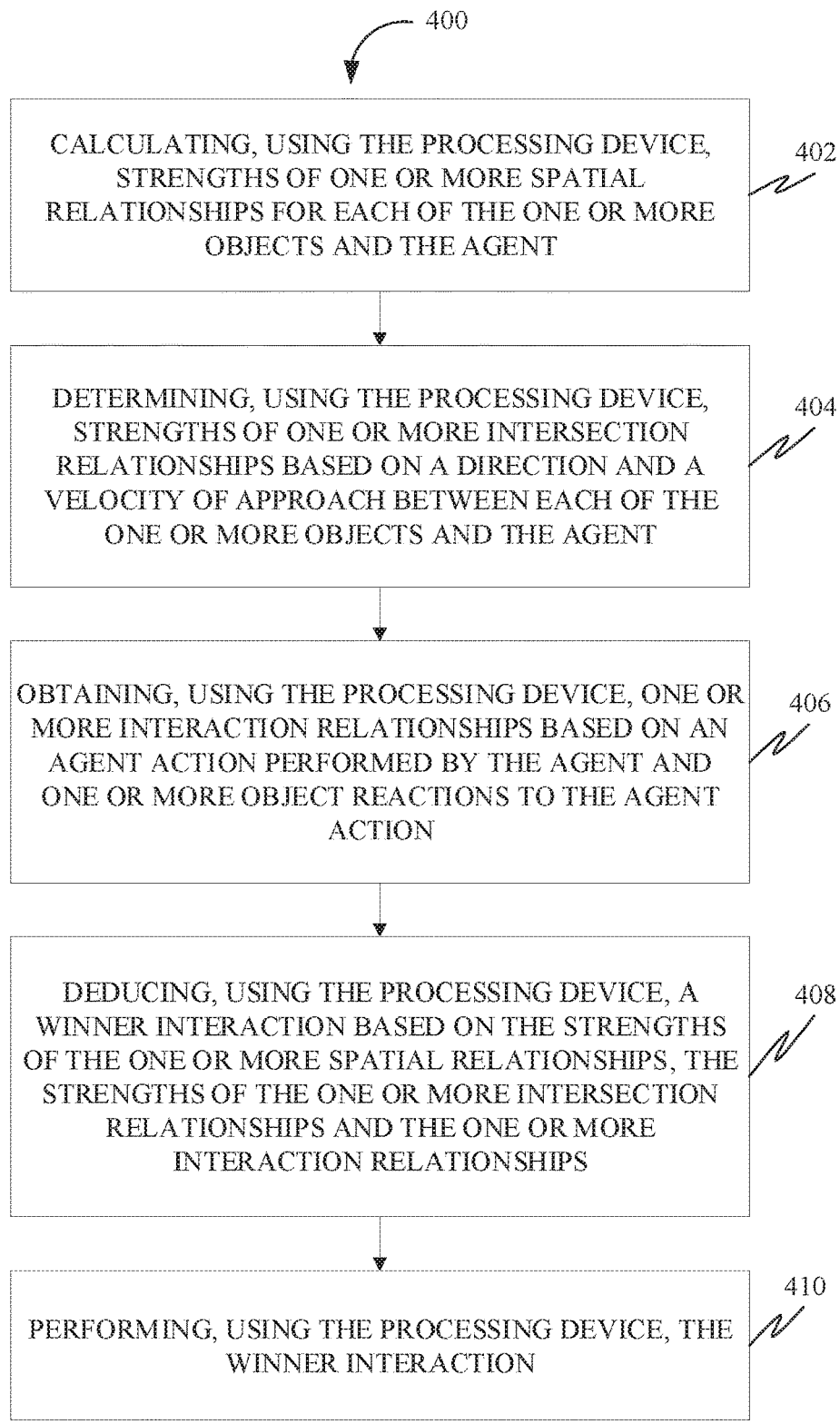
FIG. 4 is a method for performing a winner interaction, in accordance with some embodiments.

FIG. 4 is a method 400 for performing a winner interaction, in accordance with some embodiments. At 402, the method 400 may include calculating, using the processing device, strengths of one or more spatial relationships for each of the one or more objects and the agent.

At 404, the method 400 may include determining, using the processing device, strengths of one or more intersection relationships based on a direction and a velocity of approach between each of the one or more objects and the agent.

At 406, the method 400 may include obtaining, using the processing device, one or more interaction relationships based on an agent action performed by the agent and one or more object reactions to the agent action.

At 408, the method 400 may include deducing, using the processing device, a winner interaction based on the strengths of the one or more spatial relationships, the strengths of the one or more intersection relationships and the one or more interaction relationships.

At 410, the method 400 may include performing, using the processing device, the winner interaction.

Figure 5:
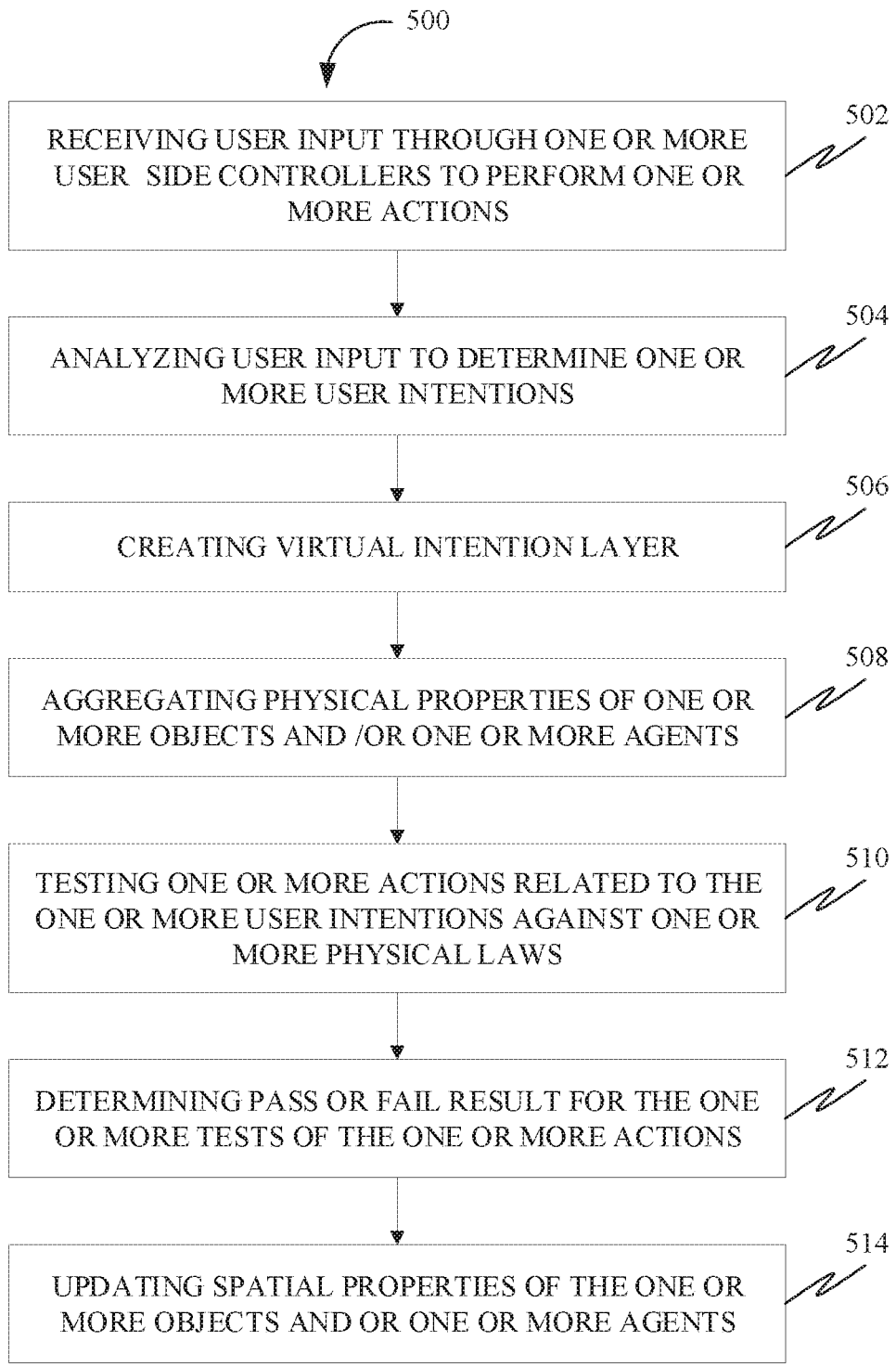
FIG. 5 is a method to facilitate simulation of realistic interactions between physical objects in a virtual space based on user intention.

FIG. 5 is a method 500 to facilitate simulation of realistic interactions between physical objects in a virtual space based on user intention. Further, at 502, the method 500 may include receiving input through a user side controller to perform one or more actions. The user side controller may include a controlling device, such as a joystick, a video game console, or a generic input device such as a keyboard, and may be used to provide an input corresponding to a simulation. Alternatively, the user side controller may include a special device that may be particular to the simulation that may be running to provide an input corresponding to the simulation. For instance, the special user side controller may include, but may not be limited to a racing wheel if the simulation is a racing game or a voice-based controller that may receive voice inputs through a microphone and influence the simulation that may be running. Accordingly, the input received from the user side controller may be in the form of the press of a button, movement of a joystick, manipulation of a wheel, voice input, or a combination of any of these. The input received from the user side controller may manipulate the one or more physical objects in the simulation and lead to the performance of one or more actions by the one or more physical objects.

Further, at 502, the method 500 may include a step of analyzing the user input to determine one or more user intentions. The one or more user intentions may be mapped to one or more input values associated with the user side controller that may be used to control the simulation. The one or more user input values may lead to the manipulation of certain actions or movements of one or more agents (one or more characters that may be controlled by the user) or the physical objects in the simulation. Further, the one or more user intentions may correspond to certain movements of the one or more agents or physical objects. Accordingly, the one or more user input values received from the user side controller may be analyzed. The one more user input values may be compared to one or more user intentions mapped to the one or more user input values. Based on the comparison, the one or more intentions may be determined. Further, in an embodiment, the one or more input values may not correspond directly to one or more user intentions. However, the one or more user input values may be close to one or more user input values that may include one or more user intentions mapped. Accordingly, one or more user intentions may be recognized from one or more user input values even if the user input values may be slightly wrong.

Further, at 506, the method 500 may include a step of creating a virtual intention processing layer. The virtual intention processing layer may be created beyond the event handler in a simulation that may be running. The intention processing layer may perform the analysis of one or more user intentions and analyze whether one or more actions, as defined in the one or more user intentions, may be performable by the one or more physical objects in the simulation.

Further, at 508, the method 500 may include a step of aggregating physical properties of one or more objects and/or one or more agents. The physical properties of the one or more physical objects and/or the one or more agents may include the mass, size, dimensions, etc. of the one or more physical objects and/or the one or more agents. Further, the physical properties of the one or more physical objects and/or the one or more agents including the size, volume, mass etc. may be combined with the positional information of the one or more physical objects and/or the one or more agents to determine a spatial relationship of the one or more physical objects and/or the one or more agents. Positional information may include information such as location, posture, alignment, etc. of the one or more physical objects and/or the one or more agents in the virtual space of the simulation. The spatial relationship may describe the location, posture, alignment, etc. of each of the one or more physical objects and/or the one or more agents in the virtual space of the simulation with respect to other one or more physical objects and/or the one or more agents in the virtual space of the simulation.

Further, at 510, the method 500 may include a step of testing the one or more actions related to the one or more user intentions against one or more physical laws. The one or more actions may be performable by the one or more physical objects and/or the one or more agents in the virtual space of the simulation. Further, the one or actions may be governed by one or more physical laws of the simulation. The one or more physical laws may define the manner in which the one or more physical objects and/or the one or more agents in the simulation may move, interact, or collide. Accordingly, a series of pass or fail tests may be generated for the one or more actions. The one or more pass or fail tests may subject the one or more intended actions to the physical laws of the simulation, also including the spatial relationships between the one or more physical objects and/or the one or more agents. The one or more actions may be deemed possible or not possible based on the physical laws of the simulation and the spatial relationships between the one or more physical objects and/or the one or more agents in the simulation.

Further, at 512, the method 500 may include a step of determining a pass or fail result for the one or more actions related to the one or more user intentions when tested against one or more physical laws of the simulation. When tested against the one or more physical laws of the simulations, the one or actions may be determined to have passed or failed based whether the one or actions may be possible based on the spatial relationships of the one or more physical objects and/or the one or more agents or not. For instance, if the simulation includes a simple 2D virtual world and includes two physical objects of different masses, the one or more intentions as determined through the one or more user inputs may be for the physical object with lower mass to collide with the physical object with more mass and displace the physical object with more mass. Further, the spatial relationship between the two physical objects may be analyzed along with the physical properties. The actions may be tested and analyzed against the physical laws of the simulation. Accordingly, if the physical object with the lower mass is determined to be displaced with sufficient velocity such that the physical object with more mass may be displaced upon a collision, the action may pass the test. Alternatively, if the physical object with the lower mass is not determined to be displaced with sufficient velocity to displace the physical object with more mass upon a collision, the action may fail the test.

Further, at 514, the method 500 may include a step of updating the spatial properties and the one or more agents. Upon conclusion of the one or more pass or fail tests, the one or more physical objects and/or the one or more agents may be moved. However, the one or more actions corresponding to the one or more user intentions may not be completed. Accordingly, the one or more physical objects and/or the one or more agents may occupy new positions in the virtual space in the simulation and the spatial relationship between the one or more physical objects and/or the one or more agents may be updated.

Figure 6:
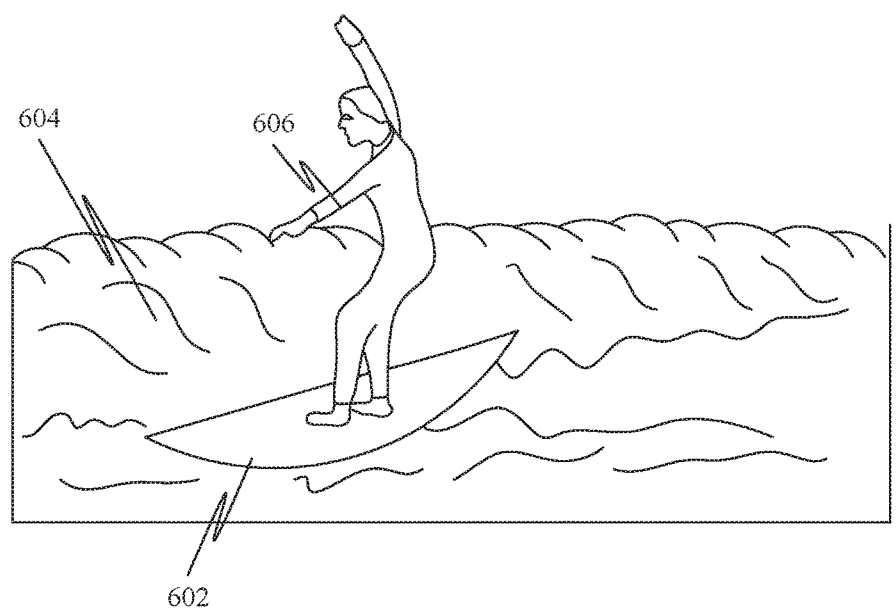
FIG. 6 is an exemplary embodiment of the system to facilitate the simulation of realistic interactions between physical objects in a virtual space based on user intention.

FIG. 6 is an exemplary embodiment of the system to facilitate the simulation of realistic interactions between physical objects in a virtual space based on user intention. The simulation may include a surfing video game, the objective of which may be for the user to surf on oncoming waves through a surfboard. The simulation may include objects such as a surfboard 602, oncoming waves 604, and an agent 606 that may be controlled by a user. The physical laws of the simulation may mirror the real laws of physics. The user may provide user input through the user side controller such as a keyboard, or a joystick, and try to surf the oncoming waves 604. Further, based on the one or more user inputs received, one or more user intentions may be determined. For instance, if the agent 606 is surfing towards an oncoming wave of the oncoming waves 604, the user may wish for the agent 606 to catch the wave. Accordingly, the user may, through an input mechanism of the user side controller, provide a series of inputs by depressing a set of keys or by manipulating the joystick. One or more user intentions may be mapped to the one or more inputs provided by the user, one of which may include catching the oncoming wave. Alternatively, the one or more inputs received may not match the user intention to catch a wave exactly. However, the one or more inputs may be determined to match the user intention of catching the oncoming wave based on the inputs provided and the position of the agent and the one or more objects in the video game. Accordingly, a set of actions corresponding to catching the oncoming wave of the oncoming waves 604 may be determined and may be subjected to one or more pass or fail tests against the one or more physical laws of the surfing video game. The result of the one or more pass or fail tests may also depend on the special relationship of the one or objects, including the surfboard 602, the oncoming waves 604, and the agent 606 in the surfing video game. Accordingly, if based on the special relationship of the one or objects and the agent 606 in the video game, such as the position of the agent 606 on the surfboard 602, the posture of the agent 606, the velocity of the oncoming wave, and so on, and the physical laws of the video game, the one or more pass or fail tests are determined to be passed, the agent 606 may execute the maneuver of catching the wave. Alternatively, if the result of the one or more one or more pass or fail tests are determined to be failed, the agent 606 may not be able to execute the maneuver of catching the wave and may wipeout.

Figure 7:
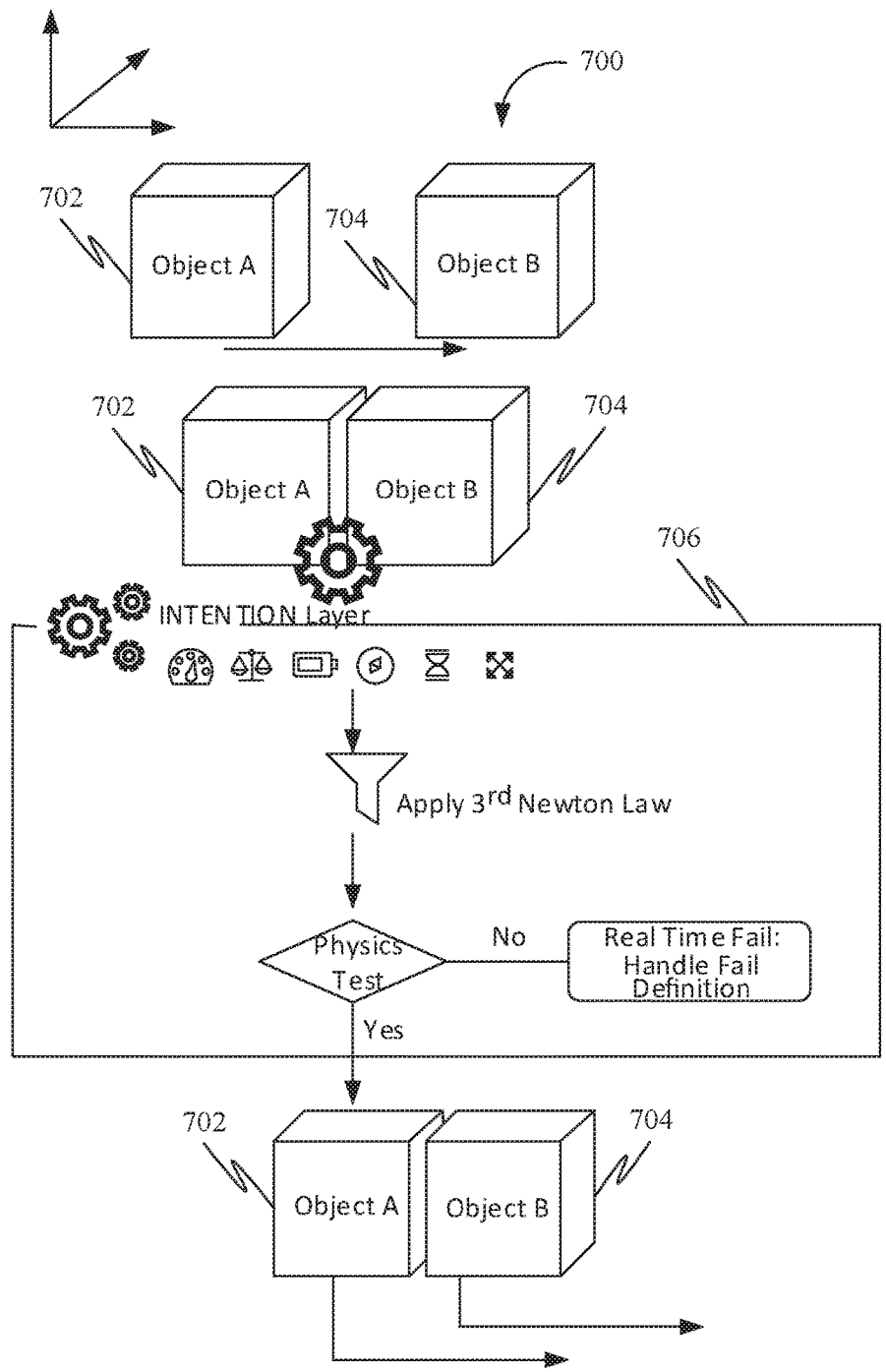
FIG. 7 is an exemplary representation of a system to facilitate the simulation of realistic interactions between physical objects in a virtual space based on user intention.

FIG. 7 is an exemplary representation of a system 700 to facilitate the simulation of realistic interactions between physical objects in a virtual space based on user intention. The system 700 may include with a virtual 3D space, containing two objects (object a 702, and object b 704). The user may provide an input through a user side controller. The user may provide input to move the object a 702 towards the object b 704 with the intention of pushing the object b 704. As such, object a 702 may collide with object b 704, and the collision event may be delegated to an intention processing layer 706. In the intention processing layer 706, the spatial relationship of the object a 702, and object b 704 may be determined by analyzing the velocity, mass, energy, positions, acceleration, and the vector of the object a 702, and object b 704. Accordingly, one or more relevant physical laws of the simulation, such as Newton's third law of motion, may be applied and one or more pass or fail tests may be performed to determine whether the one or more actions of the objects as determined by the user intention may be possible. Further, based on whether the one or more tests give the result as a pass, or a fail, the object a 702, and object b 704 may be moved. If the one or more pass or fail tests give the result as pass, the object a 702 may collide with object b 704 and move the object b 704. Alternatively, the object a 702 may not collide with object b 704, or may not move the object b 704 even after movement and collision.

Figure 8:
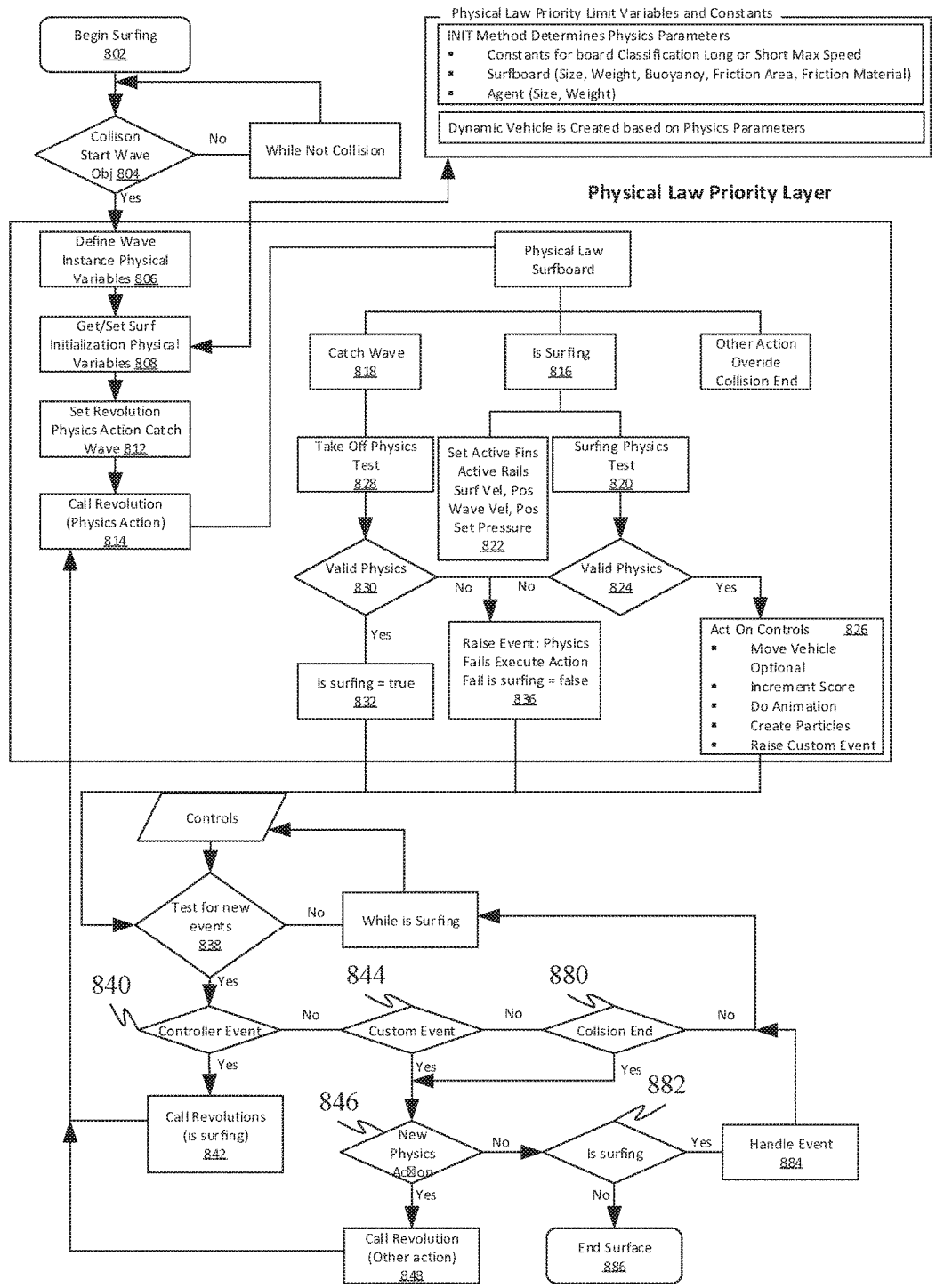
FIG. 8 is an exemplary method to facilitate the simulation of realistic interactions between physical objects in a virtual space, such as a surfing video game, based on user intention.

FIG. 8 is an exemplary method 800 to facilitate the simulation of realistic interactions between physical objects in a virtual space, such as a surfing video game, based on user intention. Further, the objective of the surfing video game may be for the user to surf on oncoming waves through a surfboard. The simulation may include objects such as a surfboard, oncoming waves, and an agent that may be controlled by the user. The physical laws of the simulation may mirror the real laws of physics. At 802, the method 800 may include a step of beginning the surfing simulation. After beginning the surfing simulation, at 804, the method 800 may include a step of determining whether the surfboard has begun colliding with a wave object. If the surfboard has begun colliding with a wave object, the surfing procedure may be determined to be initialized. Accordingly, at 806, the method 800 may include a step of defining wave instance physical variables. Further, at 808, the method 800 may include a step of retrieving surf initialization physical variables by determining physical parameters of the surfboard by Init method 810. Physical parameters may include constants for board classification such as length, size, weight, buoyancy, and one or more physical parameters of the agent such as the size, weight, height etc. of the agent on the surfboard. Accordingly, a dynamic vehicle may be created based on physical parameters of the agent and the surfboard. Further, at 812 the method 800 may include a step of retrieving the physical laws for the action of catching a wave and using the physical laws for the action of catching a wave to set up a pass or fail test loop to determine whether the agent may catch a wave and continue to surf or fail to catch a wave and wipeout. Further, at 814, the method 800 may include a step of applying the one or more physical laws of the simulation to determine whether the agent may be surfing 816, not surfing, or catching a wave 818 while surfing. In an instance, at 820, the physical laws of the simulation 822 may be used to determine whether the agent may be surfing based on the velocity of the surfboard, the wave, etc. If at 824, the physical laws of the simulation are determined to be valid, the agent is determined to be surfing, at 826, the method 800 may include allowing the agent to be controlled while surfing through a user side controller. Further, at 828, the method 800 may include using the physical laws of the simulation to determine whether the agent may be able to perform the action for catching a wave. Further, at 830, the physical laws of the simulation may be determined to be valid. If at 832, the agent is determined to have successfully performed the action for catching a wave, the simulation may allow the agent to be controlled while surfing through a user side controller. Alternatively, at 836, if the agent is determined to not be surfing, or not having performed the action for catching a wave, the agent may not be determined to be surfing and an event for wipeout may be generated. Further, at 838, the method 800 may include a step of testing for new events, such performing a trick, or controlling the agent through the input received from a user side controller. If the event is a controller event 840, revolutions may be called at 842. Further, the event may be determined to be a custom event at 844. If the event is a custom event the event may be determined to include a new physics action at 846. Further, if the event includes a new physics action, revolutions may be called at 848. Alternatively, if the event is not a custom event, the objects and the agent may be tested to determine whether a collision between the one or more objects may have ended at 850. If an active collision is detected and includes a new action, the new action may be subject to a pass or fail test. Alternatively, if a new action is not detected, a test may be run to determine whether the agent may be surfing at 852. If the agent is determined to be surfing, the surfing event may be handled by subjecting the movement of the agent to one or more pass or fail tests at 854. Alternatively, if the agent is determined to not be surfing, the simulation may stop at 856.

Figure 9:
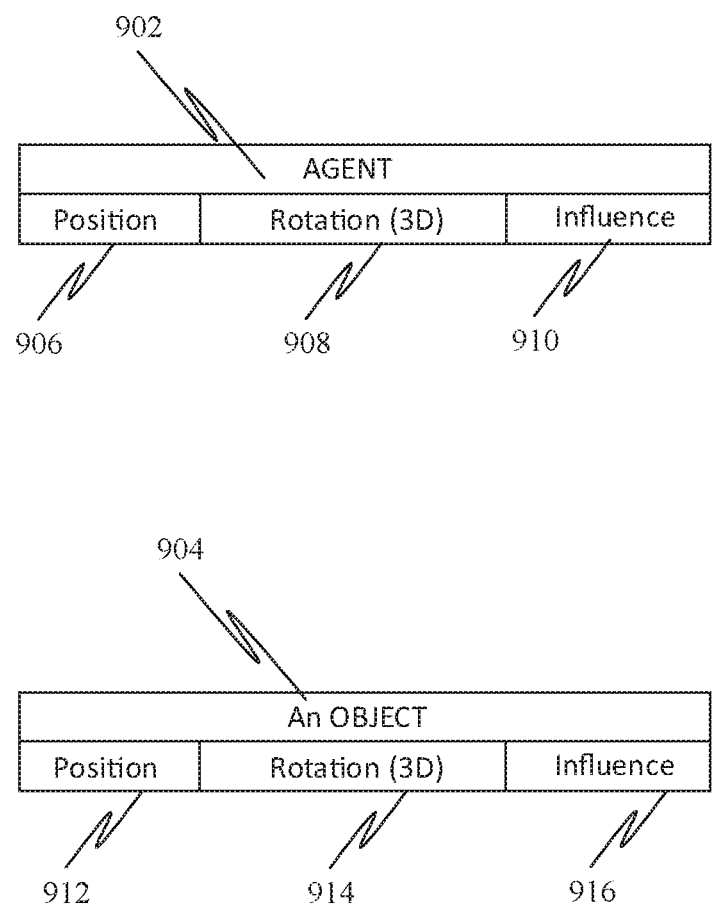
FIG. 9 is a visualization showing an agent, an object, and properties possessed by the agent and the object.

An object under direct control of a user of the system may be called as an agent 902. An agent 902 in a virtual space, such as a virtual 2D space or a virtual 3D space may have a spatial relationship to an object 904 by a distance of two influences. The strength of the spatial relationship between the agent 902 and the object 904 may be measured from origin (0,0) corresponding to a top/left corner for the virtual 2D space. Further, the strength of the spatial relationship between the agent 902 and the object 904 may be measured from and a world center in a virtual 3D space. Further, as shown in FIG. 9, the agent 902 may possess properties including position 906, rotation 3D 908, and influence 910. Further, the object 904 may possess properties including position 912, rotation 3D 914, and influence 916.

Further, the agent 902 may possess a potential to intersect with other objects in the virtual space. Further, when either the agent 902 or object 904 is moved, the spatial relationship between the agent 902 and the object 904 may change. The change in the spatial relationship may add a magnitude creating a vector. An intersection potential between the agent 902 and the object 904 may also change and may be increased or decreased. The intersection potential may be called as an intersection relationship.

Further, direction of intersection potential between the agent 902 and the object 904 may be defined by influence of the angular threshold and expressed as with, against or neutral. Agents and the objects heading in the same direction may be said to be with. Further, the agents and the objects towards each other may be said to be against. Further, the agents and the objects in parallel may be said to be neutral. Further, a strength of the intersection relationship may be expressed as direction and displacement/time.

Further, the agent 902 may interact with the object 904 in the virtual space. Further, an interaction relationship may describe how the agent 902 may use the object 904. Further, the reaction of the object 904 to the agent 902 may define the intersection relationship. Further, the interaction and the reaction may be predefined constants expressed as verbs. Reserved verb xx definitions may be offered, with a possibility of more definitions to be added as required.

Further, the interaction relationship may not have strength. Further, interaction relationships may work together when interaction and reaction may be congruent. Further, when interaction and reaction may work oppositely, the interaction and reaction may be incongruent or pass, and a winner may be determined by application of physics.

Further, a user, through input, may control the agent. User intention may be defined as a will of the user to interact with an object, such as the object 904. Further, user intention may be determined by weight of order of probability in consideration of the strength of the spatial relationship, the strength of the intersection relationship, and the ability of the agent 902 to win the interaction relationship for all objects in a scene for each frame.

When user intention has been established and the spatial relationship influence and the intersection relationship angular threshold are met, the user may engage a user action.

Further, a user action may exist for each interaction relationship and each defined input. Further, the agent 902 may have a default action for each interaction and defined input when no other action is engaged. Further, engaged user actions may be persistent until changed by user input or spatial or intersection relationships is lost.

Further, a virtual simulation engine (or a game engine) configured to generate, and run the virtual simulation engine may include a plurality of physical objects, including, but not limited to static bodies, rigid bodies, and kinematic bodies. Static bodies may not be moved by a physics engine or code of the virtual simulation engine. Further, static bodies may participate in collision detection and collision response.

Further, rigid bodies may implement the physics engine for movement and participate in collision detection and collision response. Further, the code of the virtual simulation engine may not have control over the movement of the rigid bodies and may apply forces such as gravity or impulses. Further, the physics engine may calculate movement due to the forces such as gravity or impulses. Further, rigid bodies may possess have physical properties such as mass, weight, gravity scale, and velocity etc.

Further, kinematic bodies may be exclusively moved by the code of the virtual simulation engine. Further, the kinematic bodies may support collision detection and collision response. Further, the kinematic bodies may not possess physical properties and may be moved by the virtual simulation engine by setting bodies vector components velocity <x.vel,y.vel,z.vel>. Further, kinematic bodies may be controlled by the code of the virtual simulation engine and may be easily manipulated by user input events.

Further, predictive applied physics may include one or more subcomponents for adding real physics to a loop virtual simulation for realistic interaction between one or more agents, such as the agent 902 and objects.

Further, a physics module may include a passive form of the physics engine and may contain methods for determining applied physics. Further, the physics module may not control or move physical objects directly. Further, purpose of the physics module may be a disambiguation of applied physics. Further, the physical module may include resource methods, comprising calculations of physics values for use by the virtual simulation engine or the physics engine. Further, the physical module may include predictive methods comprising calculation of projected results for user intention, such as petition of the object 904, collision times, pass or failure of user interaction, and so on. Further, the physical module may include application methods comprising calculation for real-time application of object 904 physics.

Further, objects, such as the object 904 may include dynamic physical properties. Further, dynamic physical properties may be used to correlate movement. Velocity of a kinematic object 904 or force of a rigid body may be adjusted to correlate movement between the physics engine, and the virtual simulation engine resulting in a more realistic visual render.

Further, dynamic physical properties may be used to generate accurate predictions for interaction based on user interaction and user intention. Further, dynamic physical properties may be used to create scale relationships. Further, scale relationships may allow for physical properties of an object 904 to be defined at one value and changed in scale. Further, the physics module may return a scaled resource value necessary to adjust value of the velocity of a kinematic object, or a type of input force of a rigid body. Further, dynamic physical properties may be used to create physical relationships. When an object 904 may implement another object, the physical relationship may change the physical properties of both objects.

Further, dynamic physical properties may include descriptive properties used to describe the object 904 physically. Further, descriptive properties may include C++ Long datatype of 64 bits and may be bit masked for 8 bytes. Further, each byte may contain a physical property, including gravity, friction, power, weight, speed, acceleration, force, mass, and so on.

Further, descriptive properties may be applied to rigid body objects and may be properties of the object. Further, due to being dynamic, descriptive properties may be changed at any time during the virtual simulation loop. Further, spawning may include instantiating a clone of an object. Further, when the object 904 is spawned, the object 904 may inherit physical properties and scale natively based on the descriptive properties. Further, when descriptive properties are applied to kinematic body objects, descriptive properties may be properties of the agent, allowing the agent 902 to scale with gameplay.

Further, dynamic physical properties may include an application property. Further, the application property may be an optional property for rigid body objects and may be used by application methods of the physics module for real-time physics simulation. Further, a physics module application interface may provide defined constants for applied physics. Further, if a rigid body is assigned application property constant of a car and optionally applied to real-time application methods, the virtual simulation may subject applied physics for the physical properties of the car.

Figure 10:
FIG. 10 is a table including a plurality of verbs, and corresponding information, including interaction, and congruency, in accordance with some embodiments.

FIG. 10 is a table 1000 including a plurality of verbs, and corresponding information, including interaction, and congruency, in accordance with some embodiments. As shown in row 1002, verb "use" may be used by an agent, where the agent may use the object. Further, the congruency, and incongruence may not be applicable.

As shown in row 1004, verb "pass" may be used by an agent or an object, where the agent may ignore the object, or vice-versa. Further, the congruency, and incongruence may not be applicable.

As shown in row 1006, verb "push" may be used by an agent or an object, where the agent may push the object, or vice-versa. Further, the verb may be congruent on pull. Further, the verb may be incongruent on push.

As shown in row 1008, verb "pull" may be used by an agent or an object, where the agent may pull the object, or vice-versa. Further, the verb may be congruent on push. Further, the verb may be incongruent on pull.

As shown in row 1010, verb "static" may be used by an agent or an object, where no change may occur to the agent or the object. Further, the verb may be congruent on static. Further, the verb may be incongruent on win or lose.

As shown in row 1012, verb "dynamic" may be used by an agent or an object, where the agent or the object may be controlled. Further, the verb may be congruent on push or pull. Further, the verb may be incongruent on win or lose. Further, the incongruence may not be applicable.

As shown in row 1014, verb "implements" may be used by an agent, where the agent may see dynamic properties. Further, the congruency, and incongruence may not be applicable.

Figure 11:
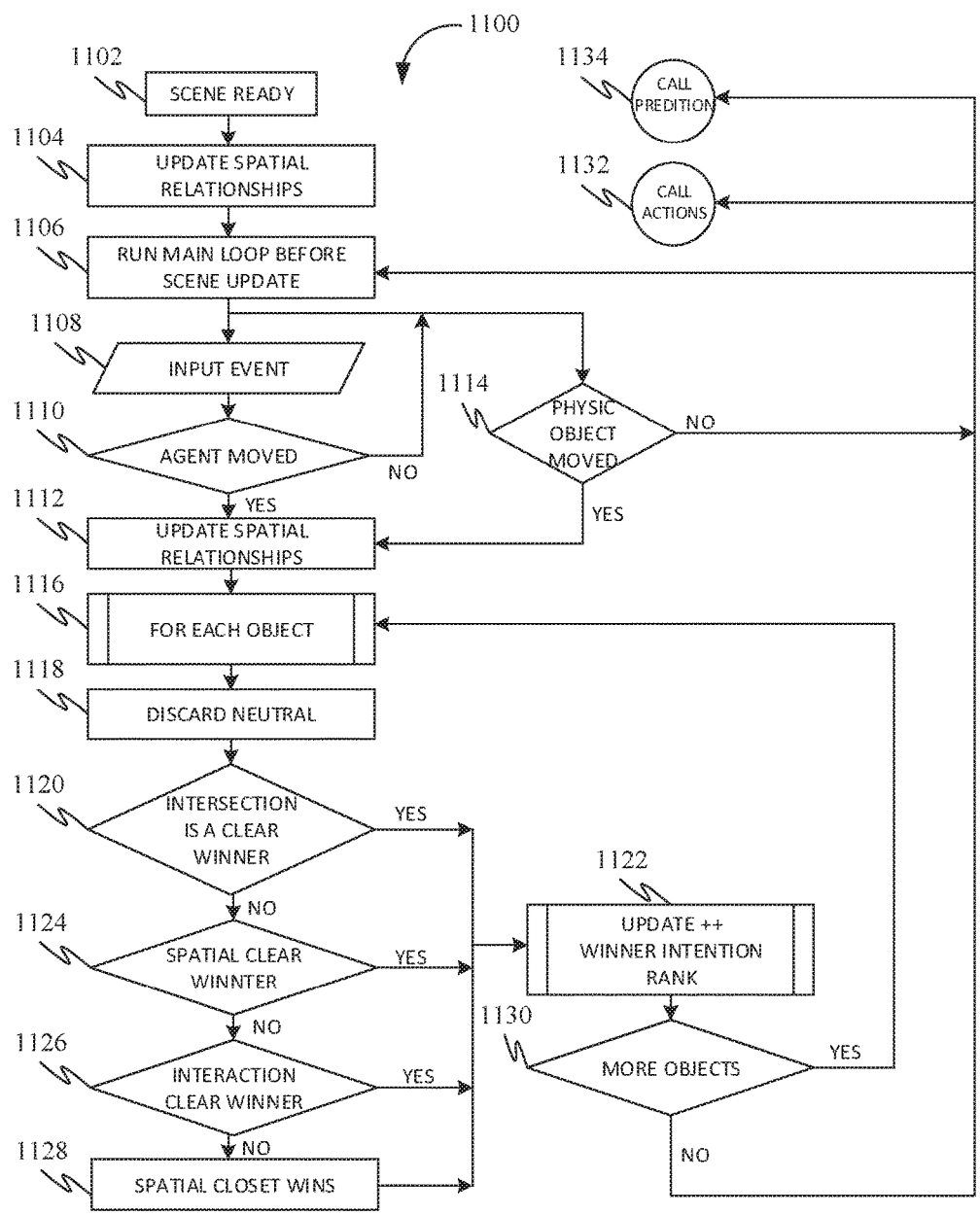
FIG. 11 is a flowchart of a method to determine user intention, in accordance with some embodiments.

FIG. 11 is a flowchart of a method 1100 to determine user intention, in accordance with some embodiments. Further, at 1102, the method 1100 may include readying a scene. Further, at 1104, the method 1100 may include updating spatial relationships. Further, at 1106, the method 1100 may include running main loop before scene update. Further, at 1108, the method 1100 may include receiving input in an input event. Further, at 1110, the method 1100 may include determining movement of agent. Further, at 1112, the method 1100 may include updating spatial relationships if agent may have moved. Further, the method 1100 may include receiving input in an input event at 1108 if agent may not have moved. Further, at 1114, after running main loop before scene update, the method 1100 may include determining if physical objects may have moved. Further, the method 1100 may include updating spatial relationships at 1112 if physical objects may have moved. Further, at 1118, the method 1100 may include discarding neutral for each object. Further, at 1120, the method 1100 may include determining, for each object, if an intersection is a clear winner. Further, if an intersection potential is a clear winner, at 1122, the method 1100 may include updating ++ winner intention rank. Further, if intersection potential is not a clear winner, at 1124, the method 1100 may include determining if a spatial relationship is a clear winner. Further, if a spatial relationship is a clear winner, at 1122, the method 1100 may include updating ++ winner intention rank. Further, if a spatial relationship is not a clear winner, at 1126, the method 1100 may include determining if interaction is a clear winner. Further, if interaction is a clear winner, at 1122, the method 1100 may include updating ++ winner intention rank. Further, if interaction is not a clear winner, at 1128, the method 1100 may include determining a winner based on closest spatial relationship. Further, after updating ++ winner intention rank, at 1130, the method 1100 may include determining if more objects are present. Further, if more objects are present, the method 1100 may initiate again from 1116 for each object. Further, if more objects are not present, the method 1100 may include calling actions at 1132, and calling prediction at 1134.

Figure 12:
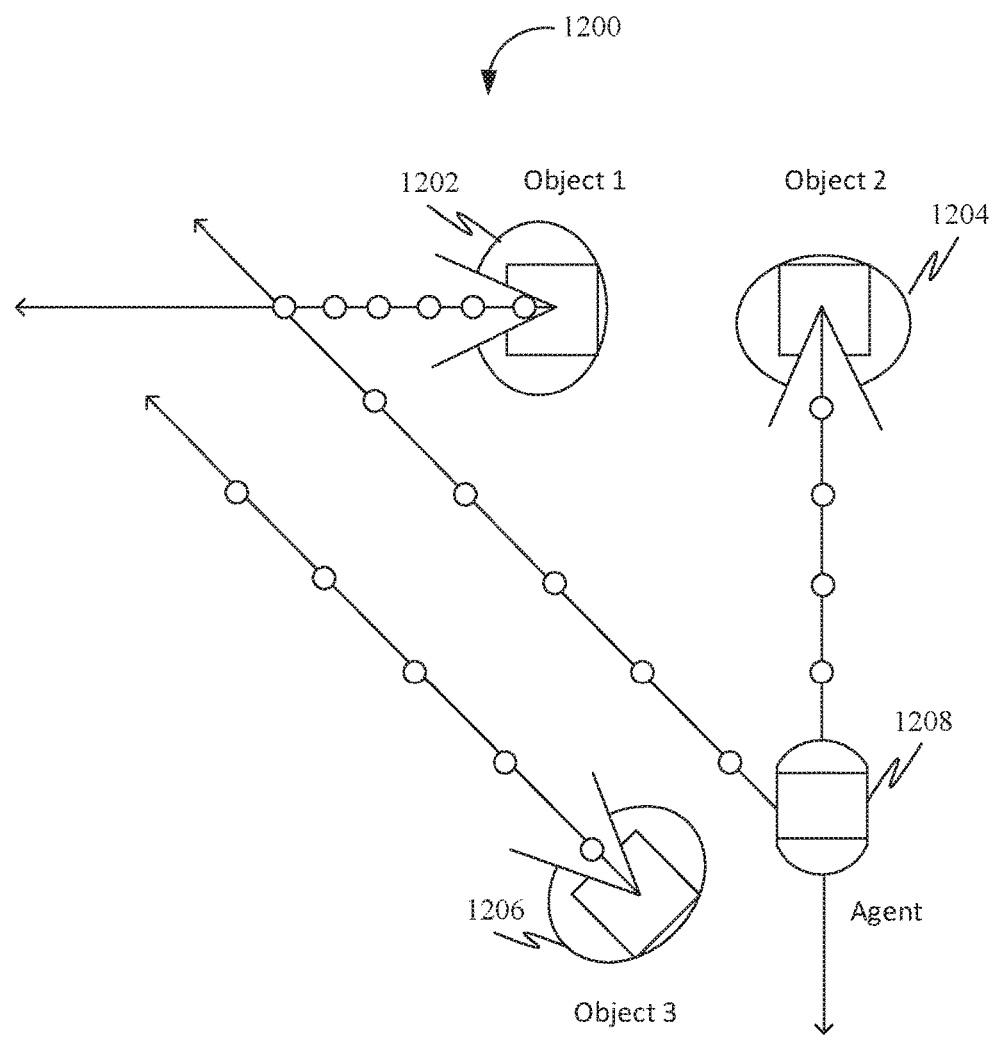
FIG. 12 is an exemplary visual representation of virtual environment to determine user intention in accordance with some embodiments.

FIG. 12 is an exemplary visual representation 1200 of virtual environment to determine user intention, such as the method 1100, in accordance with some embodiments. Further, the visual representation 1200 may include a plurality of objects, including object 1 1202, object 2 1204, and object 3 1206. Further, the visual representation 1200 may include an agent 1208. Further, when a scene including the visual representation 1200 may be ready, user interaction may not be evaluated. Further, before subsequent frames of the visual representation 1200, such as a frame 1, frame 2, and frame 3, the object 1 1202, object 2 1204, and object 3 1206, and the agent 1208 may be evaluated to determine user intention, and the object 3 1206 may be discarded due to a neutrality of the object 3 1206. Further, the object 1 1202 and the object 2 1202 may win intersection potential in n frames as agent may have a heading and speed of n frames. Further, the object 1 1202 and the object 2 1202 may win spatial relationship in n frames.

Further, before subsequent frames of the visual representation 1200, including frame 4, and frame 5, the object 1 1202, object 2 1204, and object 3 1206, and the agent 1208 may be evaluated to determine user intention, and the object 3 1206 may be discarded due to a neutrality of the object 3 1206. Further, the object 1 may win intersection potential in n frames as agent may have a heading and speed of n frames. Further, user intention may be determined as object 1 1202 may win on intersection strength.

Figure 13:
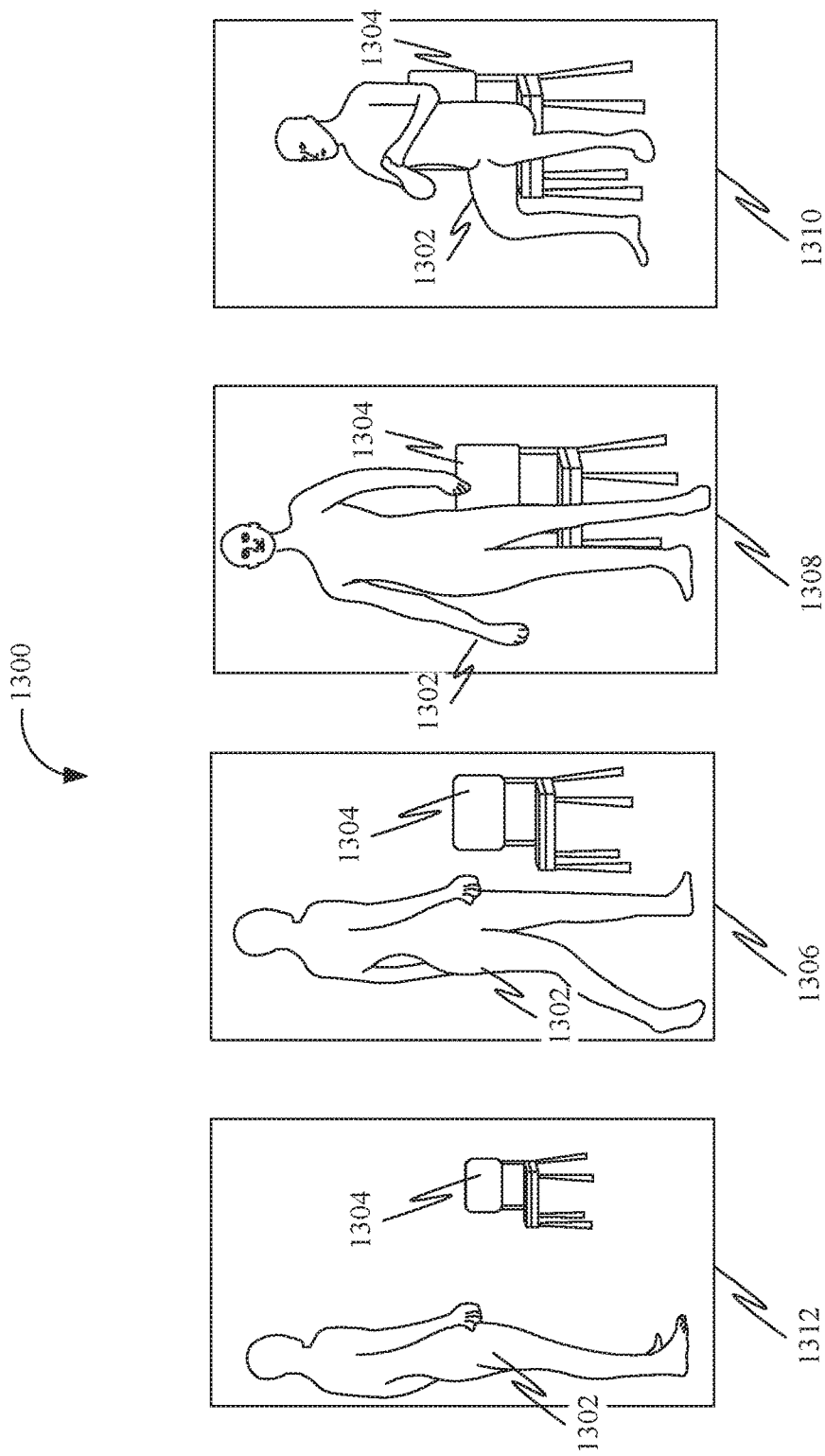
FIG. 13 is an exemplary visual render of a virtual simulation showing user action of an avatar sitting on a chair naturally, in accordance with some embodiments.

FIG. 13 is an exemplary visual render 1300 of a virtual simulation showing user action of an avatar 1302 sitting on a chair 1304 naturally, in accordance with some embodiments. One or more user actions corresponding to the avatar 1302 may be defined by a developer of the virtual simulation, such as a game.

Further, default actions may be defined for use and no intention. If no user intention is detected, a stand animation may be run on the avatar.

If user intention is detected, the stand animation may be default for intention to use any object, such as the chair 04. For all other user actions, the chair may need to win user intention. Further, the spatial relationships of <vector><rotation> of the avatar and the chair may need to meet distance and direction thresholds. Further, the avatar and the chair may need to have a congruent or will interaction relationship.

Further, to define the action of sitting, an intersection verb may need to be defined, such as "with" (facing a same direction). Further, the action may require a trigger.

Figure 14:
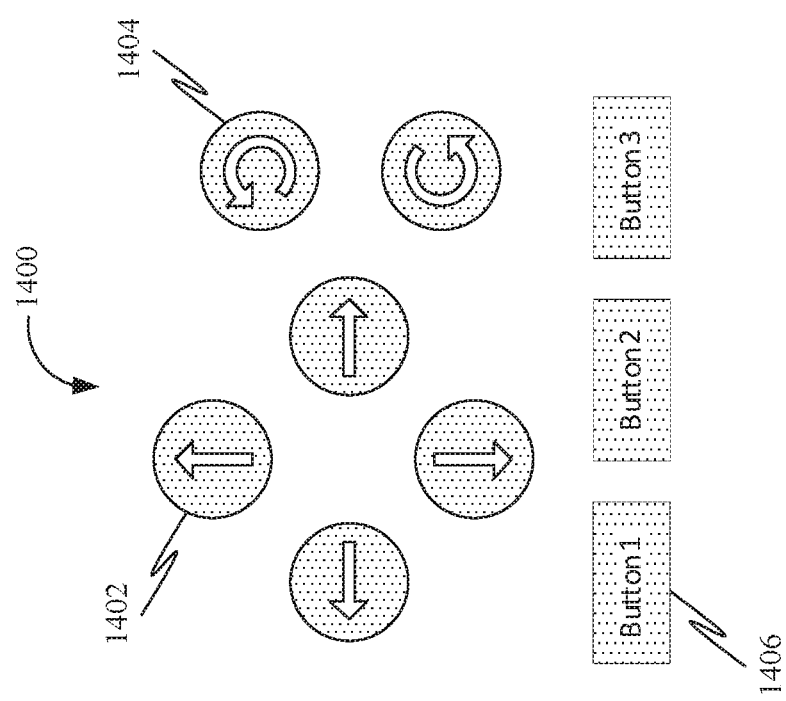
FIG. 14 is an exemplary visualization of a set of inputs corresponding to user action of an avatar sitting on a chair naturally, in accordance with some embodiments.

Further, the user action of the avatar 1302 sitting on the chair 1304 may correspond to a set of user inputs, as shown in FIG. 14.

For instance, while the avatar 1302 is standing still in frame 1312, no user input may be received Further, to move the avatar 1302 towards the chair 1304, as shown in frame 1306, a forward button 1402 may be pressed, as shown in FIG. 14.

Further, to rotate the avatar 1302 along a direction of the chair 1304, as shown in frame 1308, a rotate button 1404 may be pressed.

Further, based on the intersection potential (when the avatar and the agent may be facing the same direction), the interaction relationship, and the spatial relationship, the user intention may be determined to make the avatar sit on the chair. Accordingly, the avatar may sit on the chair, as shown in frame 1310.

Further, in an embodiment, to make the avatar 1302 sit on the chair 1304, as shown in frame 1310, a trigger may be provided, such as through button 1 1406.

Figure 15:
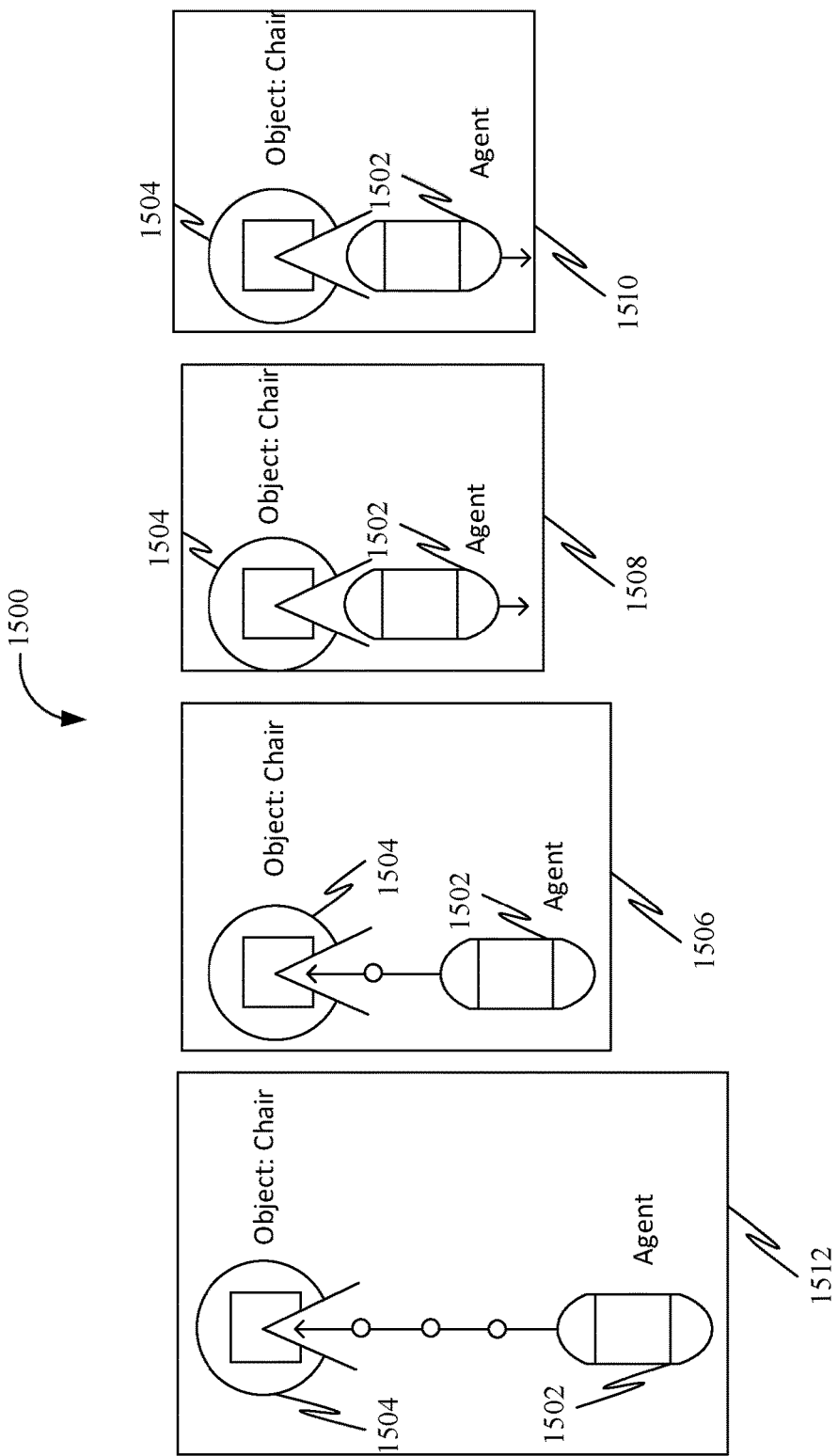
FIG. 15 is an exemplary virtual simulation loop of a virtual simulation showing user action of an avatar sitting on a chair naturally, in accordance with some embodiments.

FIG. 15 is an exemplary virtual simulation loop 1500 (game loop), of a virtual simulation showing user action of an agent 1502 interacting with an object 1504 (such as the chair 1304), such as sitting naturally, in accordance with some embodiments. Further, the virtual simulation loop 1500 may correspond to the visual render 1300.

For instance, while the agent 1500 is standing still in frame 1512, no user input may be received Further, to move the agent 1500 towards the object 1504, as shown in frame 1506, a forward button 1402 may be pressed, as shown in FIG. 14.

Further, to rotate the agent 1500 along a direction of the object 1504, as shown in frame 1508, a rotate button 1404 may be pressed.

Further, to make the agent 1500 sit on the object 1504, as shown in frame 1510, a trigger may be provided, such as through button 1 1406.

Figure 16:
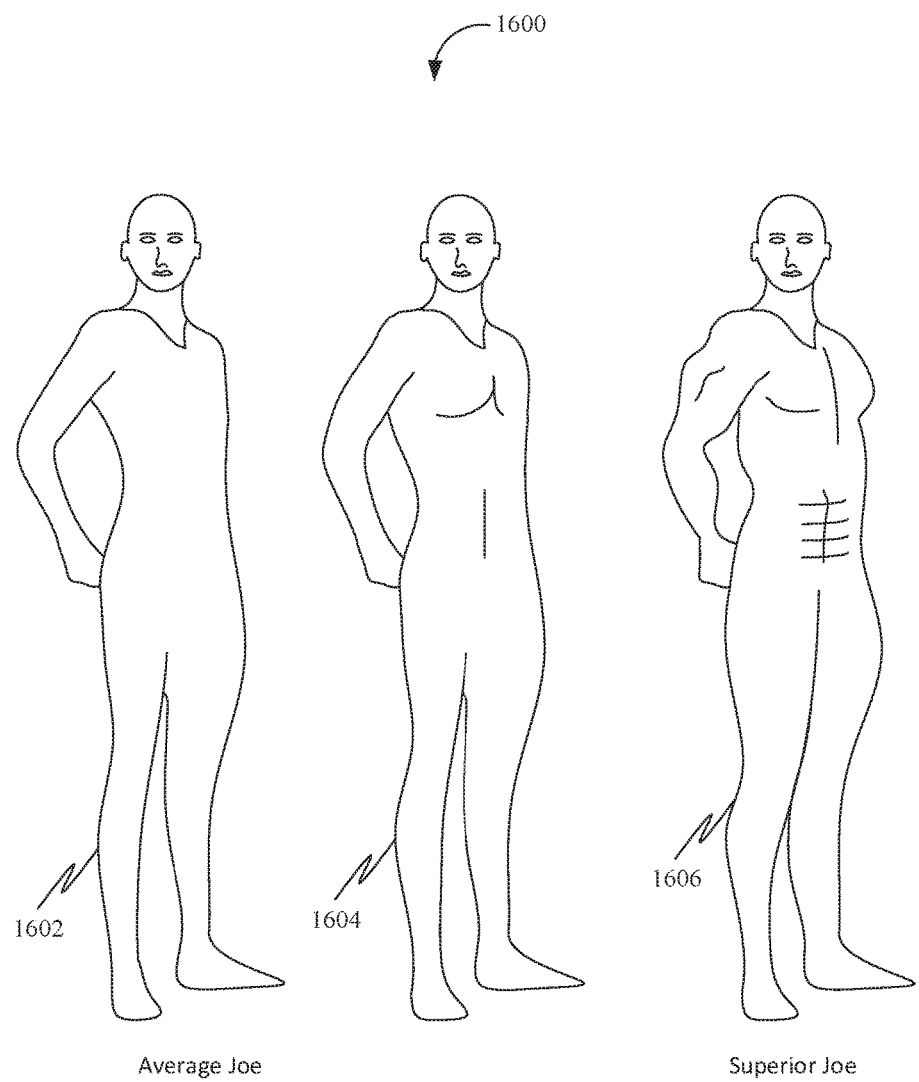
FIG. 16 is an exemplary visual representation of a plurality of agents possessing dynamic physical properties, in accordance with some embodiments.

FIG. 16 is an exemplary visual representation 1600 of a plurality of agents possessing dynamic physical properties, in accordance with some embodiments.

Further, the plurality of agents may include an average Joe 1602 assigned dynamic properties for a weight of 80 kg and power of 3 watts/kg.

Further, the plurality of agents may include an above average Joe 1604 assigned dynamic properties for a weight of 90 kg and power of 5 watts/kg.

Further, the plurality of agents may include a superior Joe 1606 assigned dynamic properties for a weight of 90 kg and power of 6 watts/kg.

Figure 17:
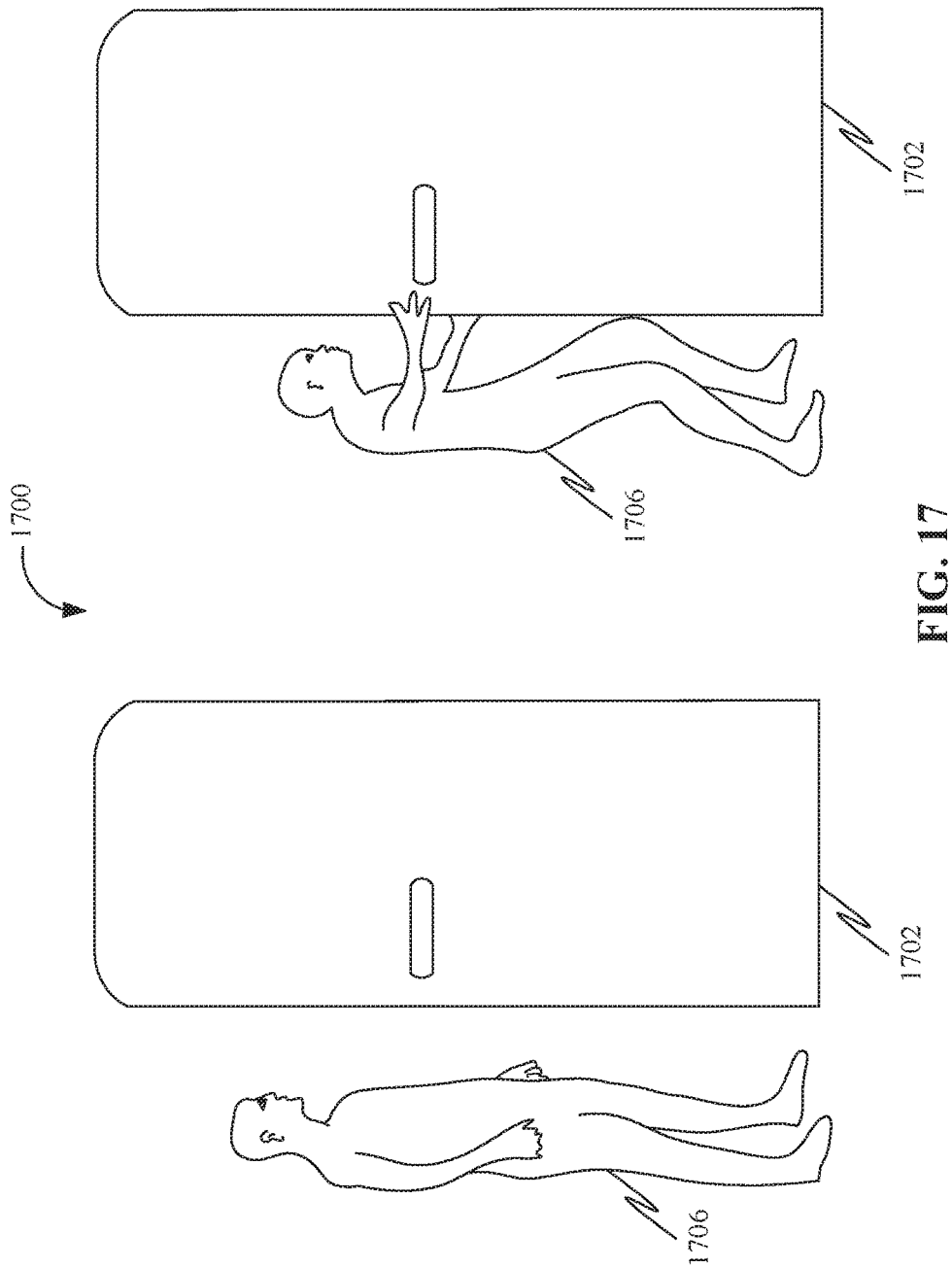
FIG. 17 is an exemplary visual representation showing predictive physics, in accordance with some embodiments.

Further, predictive physics may be applied for the plurality of agents while interacting an object, such as a refrigerator 1702 as shown in FIG. 17. For instance, if an agent 1706 (such as the average Joe 1602, the above average Joe 1604, the superior Joe 1606) pushes the refrigerator 1702, predictive physics may be applied to determine that if maximum force is applied by the plurality agent 1706, the superior Joe 1606 may push the refrigerator 1702 the farthest.

Further, the refrigerator 1702 may have a positive Y user intention for dynamic. Further, the plurality of agents may have a positive Y user intention for push and a user action of push. Further, a prediction that how far the agent 1706, and the refrigerator 1702 may move may be made while input is applied. Further, a y velocity of the agents may be increased or decreased. Further, the impulse force on the refrigerator 1702 may be increased or decreased along a y-axis corresponding to the refrigerator 1702.

Figure 18:
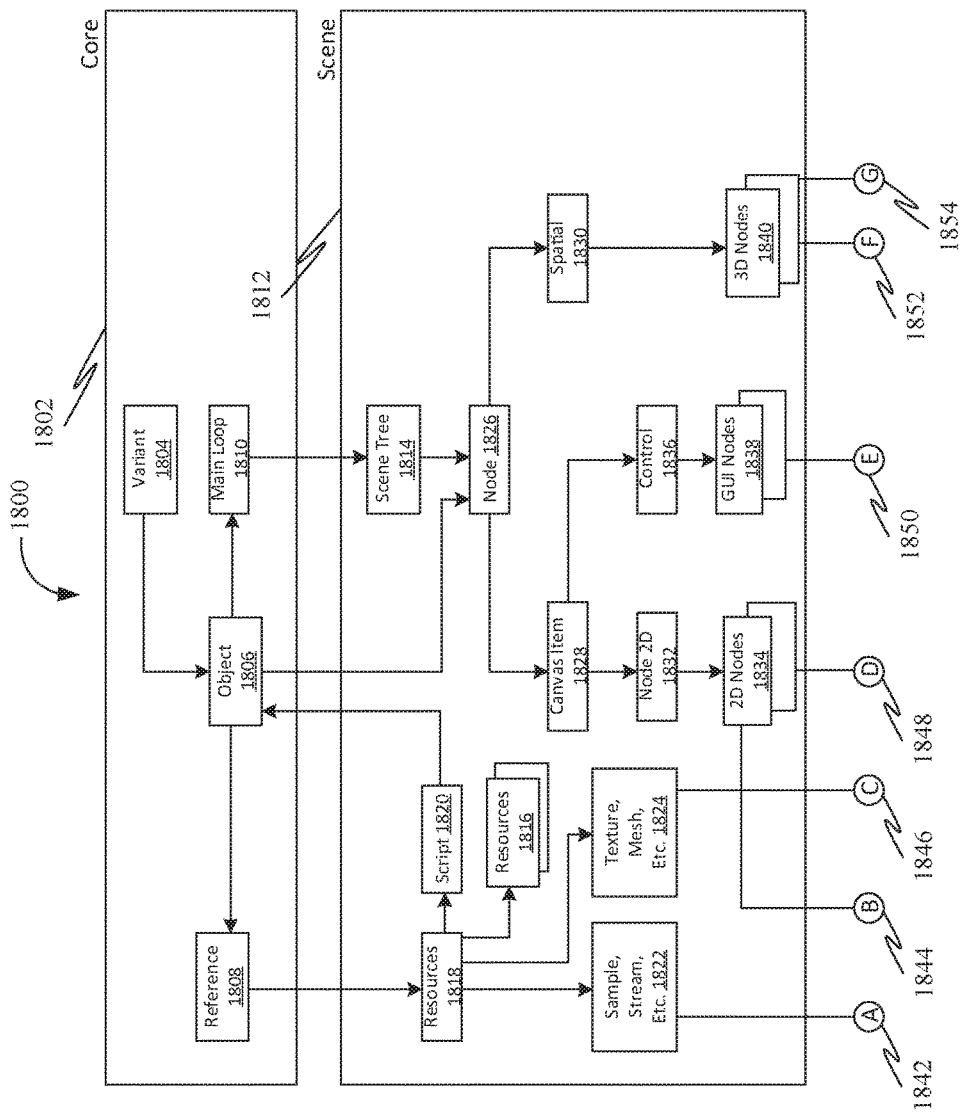
FIG. 18 shows an architecture of a virtual simulation engine, including an architectural layer to generate a virtual world including one or more objects and one or more agents based on user intention.

FIG. 18 shows an architecture 1800 of a virtual simulation engine, including an architectural layer to generate a virtual world including one or more objects and one or more agents based on user intention. Further, the architecture 1800 may include a core 1802. Further, the core 1802 may include a variant 1804 including an object 1806. Further, the object 1806 may include a reference 1808, and a main loop 1810.

Further, the architecture 1800 may include a scene 1812. Further, the scene 1812 may include a scene tree 1814 connected to the main loop 1810. Further, the scene 1812 may include resources 1816, and resources 1818 including a script 1820, a sample and stream 1822, and texture and mesh 1824.

Further, the scene tree 1814 may include a node 1826, including a canvas item 1828, and a spatial node 1830.

Further, the canvas item 1828 may include a 2D node 1832, including 2D nodes 1834, and a control node 1836, including GUI nodes 1838.

Further, the spatial node 1830 may include 3D nodes 1840. Further, the architecture 1800 may continue to a plurality of continuation points, including point A 1842, point B 1844, point C 1846, point D 1848, point E 1850, point F 1852, and point G 1854.

Figure 19:
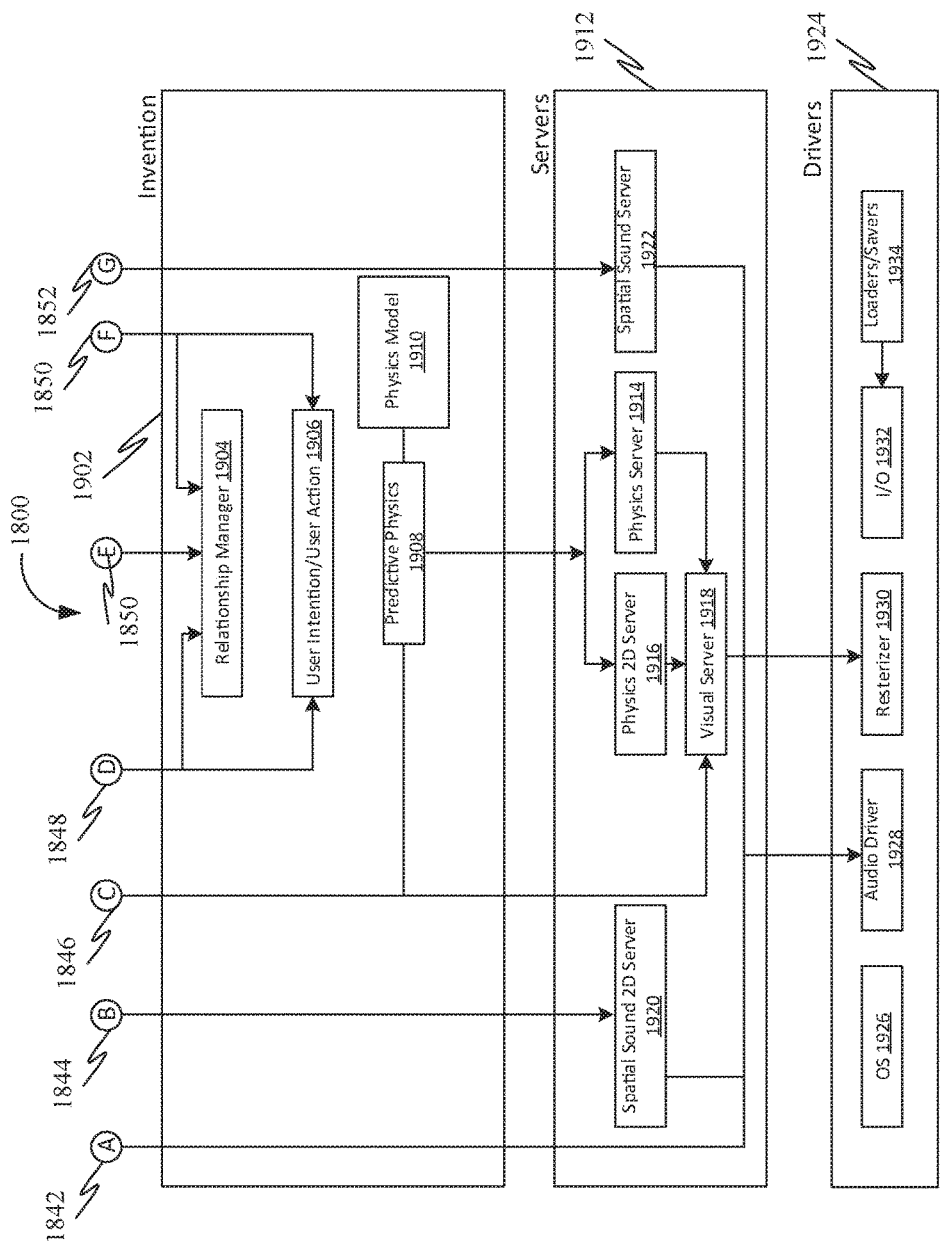
FIG. 19 is a continuation of the architecture of FIG. 18.

FIG. 19 is a continuation of the architecture 1800 of FIG. 18.

Further, the architecture 1800 may include an architectural layer 1902 to generate a virtual world including one or more objects and one or more agents based on user intention. Further, the architectural layer 1902 may include relationship manager 1904, user intention/user action 1906, a predictive physics model 1908, and a physics model 1910.

Further, the architecture 1800 may include a server layer 1912 including a physics server 1914, and a physics 2D server 1916 connected to the predictive physics model 1908.

Further, the server layer 1912 may include a visual server 1918 connected to the 1912 physics 2D server 1916. Further, the server layer 1912 may include a spatial sound 2D server 1920, and a spatial sound server 1922.

Further, the architecture 1800 may include a driver layer 1924, including an OS 1926, an audio driver 1928, a rasterizer 1930, an I/O 1932 connected to leaders/savers 1934.

Figure 20:
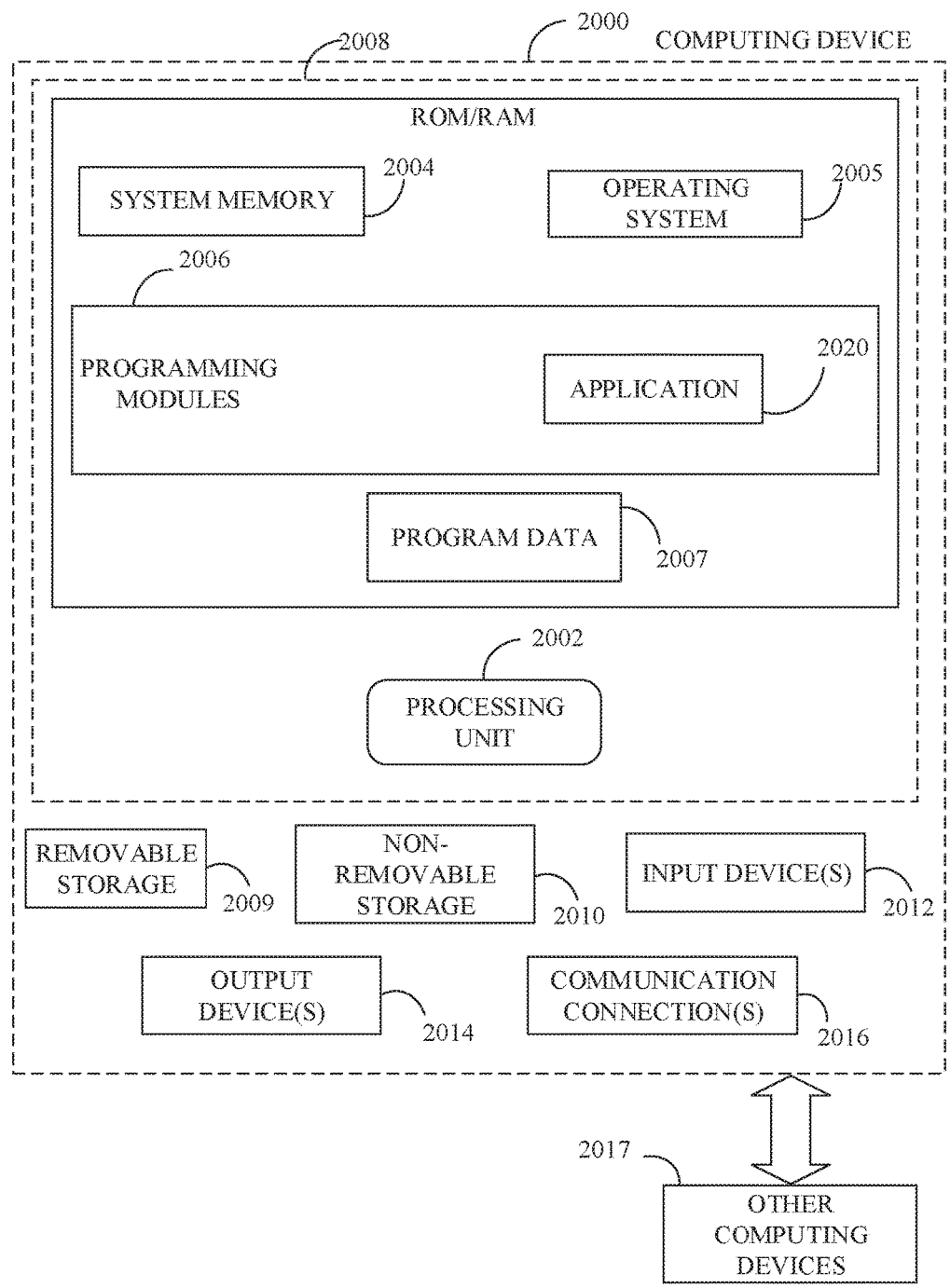
FIG. 20 is a block diagram of a computing device for implementing the methods disclosed herein, in accordance with some embodiments.

With reference to FIG. 20, a system consistent with an embodiment of the disclosure may include a computing device or cloud service, such as computing device 2000. In a basic configuration, computing device 2000 may include at least one processing unit 2002 and a system memory 2004. Depending on the configuration and type of computing device, system memory 2004 may comprise, but is not limited to, volatile (e.g. random-access memory (RAM)), non-volatile (e.g. read-only memory (ROM)), flash memory, or any combination. System memory 2004 may include operating system 2005, one or more programming modules 2006, and may include a program data 2007. Operating system 2005, for example, may be suitable for controlling computing device 2000's operation. In one embodiment, programming modules 2006 may include image-processing module, machine learning module and/or intention determination module. Furthermore, embodiments of the disclosure may be practiced in conjunction with a graphics library, other operating systems, or any other application program and is not limited to any particular application or system. This basic configuration is illustrated in FIG. 20 by those components within a dashed line 2008.

Computing device 2000 may have additional features or functionality. For example, computing device 2000 may also include additional data storage devices (removable and/or non-removable) such as, for example, magnetic disks, optical disks, or tape. Such additional storage is illustrated in FIG. 20 by a removable storage 2009 and a non-removable storage 2010. Computer storage media may include volatile and nonvolatile, removable and non-removable media implemented in any method or technology for storage of information, such as computer-readable instructions, data structures, program modules, or other data. System memory 2004, removable storage 2009, and non-removable storage 2010 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information, and which can be accessed by computing device 2000. Any such computer storage media may be part of device 2000. Computing device 2000 may also have input device(s) 2012 such as a keyboard, a mouse, a pen, a sound input device, a touch input device, a location sensor, a camera, a biometric sensor, etc. Output device(s) 2014 such as a display, speakers, a printer, etc. may also be included. The aforementioned devices are examples and others may be used.

Computing device 2000 may also contain a communication connection 2016 that may allow device 2000 to communicate with other computing devices 2018, such as over a network in a distributed computing environment, for example, an intranet or the Internet. Communication connection 2016 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 2004, including operating system 2005. While executing on processing unit 2002, programming modules 2006 (e.g., application 2020 such as a media player) may perform processes including, for example, one or more stages of methods, algorithms, systems, applications, servers, databases as described above. The aforementioned process is an example, and processing unit 2002 may perform other processes. Other programming modules that may be used in accordance with embodiments of the present disclosure may include sound encoding/decoding applications, machine learning application, acoustic classifiers etc.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general purpose graphics processor-based systems, multiprocessor systems, microprocessor-based or programmable consumer electronics, application specific integrated circuit-based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

Although the invention has been explained in relation to its preferred embodiment, it is to be understood that many other possible modifications and variations can be made without departing from the spirit and scope of the invention.

The invention claimed is:

1. A method of facilitating generation of a virtual world including one or more objects and one or more agents based on a user intent, the method comprising:
receiving, using a communication device, an input from a user for an agent in the one or more agents, wherein each agent in the one or more agents is defined by a position, an angular threshold of influence and an area of influence;
calculating, using a processing device, strength of a spatial relationship based on a distance between an object in one or more objects and the agent, wherein each object in the one or more objects is defined by a position, an angular threshold of influence and an area of influence;

determining, using the processing device, strength of an intersection relationship based on a direction and a velocity of approach between the agent and the object;

obtaining, using the processing device, an interaction relationship based on an action performed by the agent and an object reaction to the agent action, wherein the action and the reaction are predefined; and performing, using the processing device, an interaction between the agent and the object based on the spatial relationship, the intersection relationship and interaction relationship.

2. The method of claim 1, wherein the user controls, using the communication device, the one or more agents, wherein a physics engine controls, using the processing device, the one or more objects and the one or more agents.

3. The method of claim 1, wherein the one or more agents and the one or more objects have one or more dynamical properties.

4. The method of claim 3, further comprising predicting, using the processing device, one or more parameters of the interaction based on the dynamical properties of the agent and the object using a physics engine.

5. The method of claim 1, wherein the strength of the spatial relationship is measured, using the processing device, from an origin point in a 2-Dimensional (2D) space, when the virtual world is a 2D virtual world, wherein the strength of the spatial relationship is measured, using the processing device, from a world center in a 3-Dimensional (3D) space, when the virtual world is a 3D virtual world.

6. The method of claim 1, wherein for the intersection relationship, the velocity is rate of change of spatial relationship between the object and the agent and the direction is ascertained, using the processing device, based on the angular threshold of influence of both the agent and the object.

7. The method of claim 6, the direction is one of "with", "against" and "neutral", wherein the "with" direction is assigned, using the processing device, when the object and the agent head in the same direction, wherein the "against" direction is assigned, using the processing device, when the object and the agent head towards each other, wherein the "neutral" direction is assigned, using the processing device, when the object and the agent are moving parallel to each other.

8. The method of claim 1, wherein the interaction is based on the interaction relationship when the action and reaction are congruent, wherein the interaction is determined, using the processing device, by the physics engine, when the action and reaction are incongruent.

9. The method of claim 1 further comprising periodically updating, using the processing device, spatial relationships, intersection relationships and interaction relationships among the one or more objects and the one or more agents.

10. The method of claim 1, further comprising:

calculating, using the processing device, strengths of one or more spatial relationships for each of the one or more objects and the agent;

determining, using the processing device, strengths of one or more intersection relationships based on a direction and a velocity of approach between each of the one or more objects and the agent;

obtaining, using the processing device, one or more interaction relationships based on an agent action performed by the agent and one or more object reactions to the agent action;

deducing, using the processing device, a winner interaction based on the strengths of the one or more spatial relationships, the strengths of the one or more intersection relationships and the one or more interaction relationships; and performing, using the processing device, the winner interaction.

11. A system for facilitating generation of a virtual world including one or more objects and one or more agents based on a user intent, the system comprising:

a communication device configured for receiving an input from a user for an agent in one or more agents, wherein each agent in the one or more agents is defined by a position, an angular threshold of influence and an area of influence; and a processing device configured to:

calculate strength of a spatial relationship based on a distance between an object in one or more objects and the agent, wherein each object in the one or more objects is defined by a position, an angular threshold of influence and an area of influence;

determine strength of an intersection relationship based on a direction and a velocity of approach between the agent and the object;

obtain an interaction relationship based on an action performed by the agent and an object reaction to the agent action, wherein the action and the reaction are predefined; and perform an interaction between the agent and the object based on the special relationship, the intersection relationship and interaction relationship.

12. The system of claim 11, the communication device is configured to allow the user to control the one or more agents, and the processing device is configured to control, using a physics engine, the one or more objects and the one or more agents.

13. The system of claim 1, wherein the one or more agents and the one or more objects agent have one or more dynamical properties.

14. The system of claim 13, wherein the processing device is further configured for predicting one or more parameters of the interaction based on the dynamical properties of the agent and the object using the physics engine.

15. The system of claim 11, wherein the strength of the spatial relationship is measured, using the processing device, from an origin point in a 2-Dimensional (2D) space, when the virtual world is a 2D virtual world, wherein the strength of the spatial relationship is measured, using the processing device, from a world center in a 3-Dimensional (3D) space, when the virtual world is a 3D virtual world.

16. The system of claim 11, wherein for the intersection relationship, the velocity is rate of change of spatial relationship between the object and the agent and the direction is ascertained, using the processing device, based on the angular threshold of influence of both the agent and the object.

17. The system of claim 16, the direction is one of "with", "against" and "neutral", wherein the "with" direction is assigned, using the processing device, when the object and the agent head in the same direction, wherein the "against" direction is assigned, using the processing device, when the object and the agent head towards each other, wherein the "neutral" direction is assigned, using the processing device, when the object and the agent are moving parallel to each other.

18. The system of claim 11, wherein the interaction is based on the interaction relationship when the action and reaction are congruent, wherein the interaction is determined, using the processing device, by a physics engine, when the action and reaction are incongruent.

19. The system of claim 11, wherein the processing device is configured for periodically updating spatial relationships, intersection relationships and interaction relationships among the one or more objects and the one or more agents.

20. The system of claim 11, wherein the processing device is further configured to:
- calculate strengths of one or more spatial relationships for each of the one or more objects and the agent;
- determine strengths of one or more intersection relationships based on a direction and a velocity of approach between each of the one or more objects and the agent;
- obtain one or more interaction relationships based on an agent action performed by the agent and one or more object reactions to the agent action;
- deduce a winner interaction based on the strengths of the one or more spatial relationships, the strengths of the one or more intersection relationships and the one or more interaction relationships; and
- perform the winner interaction.

* * * * *